(12) United States Patent
Sugiyama et al.

(10) Patent No.: US 12,376,473 B2
(45) Date of Patent: Jul. 29, 2025

(54) DISPLAY DEVICE AND ELECTRONIC APPARATUS

(71) Applicant: SONY SEMICONDUCTOR SOLUTIONS CORPORATION, Kanagawa (JP)

(72) Inventors: Kouhei Sugiyama, Kanagawa (JP); Hiroaki Tsuchioka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/674,136

(22) Filed: May 24, 2024

(65) Prior Publication Data

US 2024/0315104 A1    Sep. 19, 2024

Related U.S. Application Data

(63) Continuation of application No. 17/436,740, filed as application No. PCT/JP2020/010272 on Mar. 10, 2020, now Pat. No. 12,004,403.

(30) Foreign Application Priority Data

Mar. 19, 2019    (JP) .................................. 2019-051556

(51) Int. Cl.
*H10K 59/38*    (2023.01)
*H10K 59/131*    (2023.01)
(Continued)

(52) U.S. Cl.
CPC ........... *H10K 59/38* (2023.02); *H10K 59/131* (2023.02); *H10K 59/8722* (2023.02); *H10K 59/88* (2023.02)

(58) Field of Classification Search
None
See application file for complete search history.

(56) References Cited

U.S. PATENT DOCUMENTS 10,409,114 B2 *   9/2019   Iwai .................. B32B 17/10504
10,680,052 B2     6/2020   Lee
(Continued)

FOREIGN PATENT DOCUMENTS

CN    105339835 A    2/2016
CN    107251648 A    10/2017
(Continued)

OTHER PUBLICATIONS

International Search Report and Written Opinion of PCT Application No. PCT/JP2020/010272, issued on Apr. 14, 2020, 10 pages of ISRWO.
(Continued)

*Primary Examiner* — Alexander G Ghyka
(74) *Attorney, Agent, or Firm* — CHIP LAW GROUP

(57) ABSTRACT

Provided is a display device that includes a first substrate that includes a first face and a peripheral region, a plurality of organic electroluminescent elements on the first substrate, and a plurality of color filters on the plurality of organic electroluminescent elements. The plurality of color filters includes at least a first color filter and a second color filter, and a part of the first color filter and a part of the second color filter are stacked in the peripheral region of the first substrate. The display device also includes a protection member on the plurality of color filters, a second substrate having a second face, where the second face faces the plurality of color filters, and a seal member between the first face and the second face in the peripheral region.

16 Claims, 11 Drawing Sheets

(51) Int. Cl.
    *H10K 59/80*    (2023.01)
    *H10K 59/88*    (2023.01)

(56) References Cited

U.S. PATENT DOCUMENTS

| | | | |
|---|---|---|---|
| 2005/0147899 A1* | 7/2005 | Sun | G02F 1/133514 |
| | | | 430/7 |
| 2007/0139603 A1* | 6/2007 | Saegusa | G02F 1/1339 |
| | | | 349/155 |
| 2009/0115321 A1* | 5/2009 | Hayashi | H10K 50/844 |
| | | | 313/504 |
| 2011/0228148 A1 | 9/2011 | Takata | |
| 2013/0155537 A1 | 6/2013 | Liu | |
| 2015/0123092 A1 | 5/2015 | Kikuchi et al. | |
| 2015/0221705 A1 | 8/2015 | Amano | |
| 2018/0067357 A1 | 3/2018 | Katsuta | |
| 2019/0196237 A1* | 6/2019 | Tian | G02F 1/136209 |
| 2019/0302468 A1* | 10/2019 | Koshihara | G02B 27/0172 |
| 2019/0393277 A1 | 12/2019 | An | |
| 2020/0050058 A1 | 2/2020 | Kuo | |
| 2020/0274077 A1 | 8/2020 | Ujiie | |

FOREIGN PATENT DOCUMENTS

| | | |
|---|---|---|
| CN | 207834302 U | 9/2018 |
| CN | 110308563 A | 10/2019 |
| JP | 2003203761 A | 7/2003 |
| JP | 2018-078110 A | 5/2018 |
| JP | 2019-174515 A | 10/2019 |
| KR | 10-2010-0004224 A | 1/2010 |
| KR | 20100004224 A | 1/2010 |
| KR | 20140081662 A | 7/2014 |
| KR | 10-2017-0076190 A | 7/2017 |
| KR | 20170076190 A | 7/2017 |
| WO | 2013/171966 A1 | 11/2013 |

OTHER PUBLICATIONS

Notice of Allowance for U.S. Appl. No. 17/436,740 dated Apr. 29, 2024.

* cited by examiner

DISPLAY DEVICE AND ELECTRONIC APPARATUS

This Patent Application makes reference to, claims priority to, claims the benefit of, and is a Continuation Application of U.S. patent application Ser. No. 17/436,740 filed on Sep. 7, 2021, which is a National Stage Entry of PCT/JP2020/010272 filed on Mar. 10, 2020, which claims priority benefit of Japanese Patent Application No. JP 2019-051556 filed in the Japan Patent Office on Mar. 19, 2019. Each of the above-referenced applications is hereby incorporated herein by reference in its entirety.

TECHNICAL FIELD

The present technology relates to a display device and an electronic apparatus that display images.

BACKGROUND ART

In the past, a display device in which color filters are disposed on organic electroluminescent (EL) elements has been developed. For example, providing the color filters allows light control of display colors or improvement in the characteristics of a viewing angle. Further, use of the color filters allows light shielding for wiring around a display region.

Patent Literature 1 discloses a light emitting device in which a color filter is disposed on a light emitting element using an organic EL material. In this light emitting device, first to third colored layers that pass red light, green light, and blue light therethrough form first to third color filters, respectively. The first to third color filters color the light beams of respective pixels (light emitting elements) disposed in a display region. Further, in the periphery of the display region, the first to third colored layers are stacked to form a protective portion having a three-layer structure. Such a protective portion shields the peripheral wiring disposed around the light emitting elements from light (see FIG. 16 of Patent Literature 1).

CITATION LIST

Patent Literature

Patent Literature 1: Japanese Patent Application Laid-open No. 2018-78110

DISCLOSURE OF INVENTION

Technical Problem

As described above, in the display device using the organic EL element, reflection, glare, or the like around the display region is suppressed by shielding the peripheral wiring from light. On the other hand, in the process of manufacturing the display device, there is a possibility that peeling or the like of the color filters stacked at the periphery occurs. Thus, a technique capable of improving the yield while maintaining the light shielding property at the periphery of the display region is expected.

In view of the above circumstances, it is an object of the present technology to provide a display device and an electronic apparatus that are capable of improving the yield while maintaining the light shielding property at the periphery of a display region.

Solution to Problem

In order to achieve the object described above, a display device according to an embodiment of the present technology includes an element substrate, a transparent substrate, a light shielding filter portion, and a transparent adhesive layer.

The element substrate includes a first surface, an organic EL element that emits light from a display region of the first surface, and peripheral wiring disposed to overlap in plan view with a peripheral region surrounding the display region. The transparent substrate includes a second surface facing the first surface.

The light shielding filter portion includes a first color filter disposed in the peripheral region of the first surface and a second color filter disposed on the second surface to face the first color filter, and shields the peripheral wiring from light.

The transparent adhesive layer is provided between the first color filter and the second color filter and bonds the element substrate and the transparent substrate to each other.

In this display device, the first surface of the element substrate including the organic EL element and the peripheral wiring, and the second surface of the transparent substrate are disposed to face each other. The first and second color filters are disposed to face each other on the first surface and the second surface, and the peripheral wiring is shielded from light. Further, the element substrate and the transparent substrate are bonded to each other by the transparent adhesive layer provided between the color filters. Thus, the thickness of each color filter is reduced, and peeling or the like of the color filter can be suppressed. As a result, it is possible to improve the yield while maintaining the light shielding property around the display region.

The first color filter may limit visible light having passed through the second color filter.

The second color filter may pass a light beam having a predetermined wavelength. In this case, the transparent adhesive layer may include a photocurable adhesive that is cured by the light beam having the predetermined wavelength.

The display device may further include a colored filter portion including a plurality of colored filters, each of which is disposed on one of the first surface and the second surface and transmits light beams having wavelengths different from each other to color the light of the organic EL element.

At least one of the first color filter or the second color filter may include at least one of a plurality of colored films constituting the plurality of colored filters.

The plurality of colored filters may include a first colored filter, a second colored filter, and a third colored filter that transmit the light beams having wavelengths different from each other.

The first color filter may transmit a light beam having the same wavelength as a wavelength of the first colored filter. In this case, the second color filter may transmit a light beam having the same wavelength as a wavelength of the second colored filter.

The second colored filter may be disposed on the second surface. In this case, the second color filter may include a colored film identical to a colored film of the second colored filter.

The first colored filter may be disposed on the first surface. In this case, the first color filter may include a colored film identical to a colored film of the first colored filter.

The first colored filter and the third colored filter may be disposed on the first surface. In this case, the first color filter may include a stacked film in which a colored film identical to a colored film of the first colored filter and a colored film identical to a colored film of the third colored filter are stacked.

The second color filter may include a single colored film. In this case, the first color filter may include a single colored film that transmits a light beam having a wavelength different from a wavelength of a colored film constituting the second color filter.

The second color filter may transmit red light. In this case, the first color filter may transmit blue light.

The second color filter may include a plurality of openings in each of which the second surface is exposed. In this case, the first color filter may be disposed to cover the peripheral region of the first surface.

The first color filter may include a first colored film and a second colored film that transmits a light beam having a wavelength different from a wavelength of the first colored film. In this case, the second color filter may include a third colored film that transmits a light beam having a wavelength identical to the wavelength of the first colored film, and a fourth colored film that transmits a light beam having a wavelength identical to the wavelength of the second colored film.

The first color filter may include a first stacked film in which the first colored film and the second colored film are stacked in layers, and a plurality of first openings formed on the first stacked film, the first surface being exposed in each of the plurality of first openings. In this case, the second color filter may include a second stacked film in which the third colored film and the fourth colored film are stacked in layers, and a plurality of second openings formed on the second stacked film without overlapping with the plurality of first openings in plan view, the second surface being exposed in each of the plurality of second openings.

The first color filter may include a first pattern film in which the first colored film and the second colored film are alternately disposed along a plane direction of the first surface. In this case, the second color filter may include a second pattern film in which the third colored film is disposed on the second surface to overlap with the first colored film in plan view, and the fourth colored film is disposed on the second surface to overlap with the second colored film in plan view.

The transparent adhesive layer may include a photocurable adhesive or a thermosetting adhesive.

The transparent adhesive layer may be a sealant applied to surround the display region or a filler provided between the transparent substrate and the element substrate.

An electronic apparatus according to an embodiment of the present technology includes a display device and a drive circuit.

The display device includes an element substrate including a first surface, an organic EL element that emits light from a display region of the first surface, and peripheral wiring disposed to overlap in plan view with a peripheral region surrounding the display region, a transparent substrate including a second surface facing the first surface, a light shielding filter portion that includes a first color filter disposed in the peripheral region of the first surface and a second color filter disposed on the second surface to face the first color filter, and shields the peripheral wiring from light, and a transparent adhesive layer that is provided between the first color filter and the second color filter and bonds the element substrate and the transparent substrate to each other. The drive circuit drives the display device.

MODE(S) FOR CARRYING OUT THE INVENTION

Embodiments according to the present technology will now be described below with reference to the drawings.

First Embodiment

[Configuration of Display Device]

Figure 1:
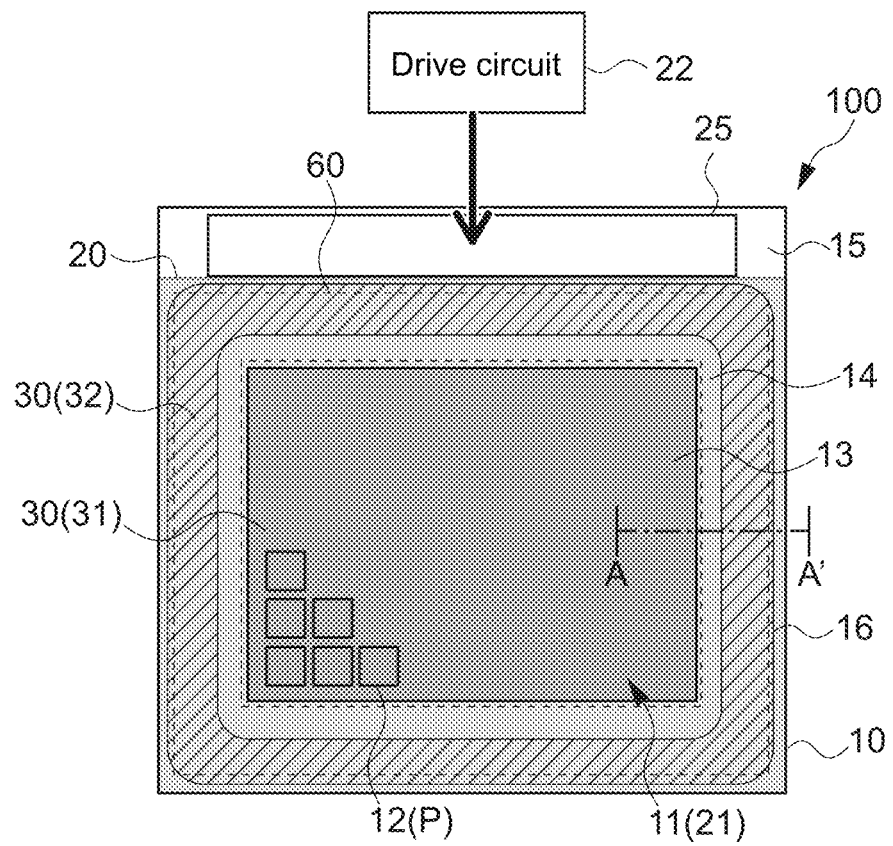
FIG. 1 is a schematic diagram showing a configuration example of a display device according to a first embodiment.

FIG. 1 is a schematic diagram showing a configuration example of a display device according to a first embodiment. A display device 100 is an organic EL display for displaying an image by driving an organic EL element.

The display device 100 is configured as a display module, for example, and is mounted on various electronic apparatuses as a viewfinder of a video camera, a digital camera, or the like and as a display of a smartphone, a tablet, or the like (see FIGS. 14A, 14B, 15A, 15B, 16, and 17, etc.). The type or the like of the electronic apparatus in which the display device 100 is used is not limited. For example, the present technology is also applicable when the display device 100 is used as a monitor for a television or PC.

FIG. 1 schematically shows a plan view of the display device 100 when viewed from the side where the image is displayed, i.e., the side where the light of the organic EL element is emitted. The display device 100 includes an element substrate 10, a transparent substrate 20 disposed on the element substrate 10, and a color filter layer 30. In the display device 100, an image is displayed through the transparent substrate 20.

The element substrate 10 includes a first opposing surface 11 that faces the transparent substrate 20, a plurality of organic EL elements 12, and peripheral wiring 60. The plurality of organic EL elements 12 constitutes a plurality of pixels P constituting an image. In FIG. 1, the square-shaped pixel P is schematically illustrated. The number of pixels, the pixel size, or the like in the display device 100 is not limited, and may be appropriately set so as to obtain desired resolution or the like. In this embodiment, the first opposing surface 11 corresponds to a first surface.

The first opposing surface 11 includes a display region 13, a peripheral region 14, and an external region 15. The display region 13 is a rectangular region in which the plurality of pixels P is arranged, and is a region in which an image is actually displayed. In this embodiment, light is emitted by the organic EL elements 12 from the display region 13 of the first opposing surface 11, and an image is displayed. Therefore, the display region 13 is a region including an effective pixel area where the pixels P contributing to actual image display are disposed.

The peripheral region 14 is a region surrounding the display region 13. That is, the peripheral region 14 is a region surrounding an image displayed on the display device 100. For example, the width of the bezel (frame portion) of the display device 100 is determined by the width of the peripheral region 14. In the example shown in FIG. 1, the peripheral region 14 is a region of the first opposing surface 11 except for the display region 13 and the external region 15 disposed outside the display region 13 and separated from the display region 13.

The external region 15 is provided on the outside of the peripheral region 14 of the first opposing surface 11, and is a region where the transparent substrate 20 is not disposed and the element substrate 10 (first opposing surface 11) is exposed (upper side in the drawing). An external electrode 25 is provided in the external region 15. A drive circuit 26 that drives the display device 100 is connected to the external electrode 25 via a flexible board or the like. The drive circuit 26 is mounted on an electronic apparatus main body and supplies power, image signals, and the like for driving the organic EL elements 12 to the display device 100. The type or the like of the drive circuit 26 or a drive signal is not limited.

The peripheral wiring 60 is disposed so as to overlap in plan view with the peripheral region 14 surrounding the display region 13. In the present disclosure, the plan view is, for example, a state viewed from a direction (normal direction) perpendicular to the surface of the transparent substrate 20 that is to be the side on which the image is displayed in the display device 100. Thus, the peripheral wiring 60 is wiring disposed on the lower layer of the peripheral region 14 so as to fit in the peripheral region 14 when viewed from the transparent substrate 20. In FIG. 1, the peripheral wiring 60 is schematically illustrated using a region of the dotted line.

The peripheral wiring 60 includes, for example, various types of wiring, circuits, and the like for driving the organic EL elements 12. Specifically, the peripheral wiring 60 includes a plurality of conductive films (metal film, transparent conductive film, and the like) formed in layers on the element substrate 10, transistors, capacitance elements, and the like. Further, the peripheral wiring 60 is appropriately connected to the external electrode 25 and each organic EL element 12 described above. A specific configuration of the peripheral wiring 60 will be described later in detail.

The transparent substrate 20 is a transparent substrate that protects the organic EL elements 12 or the like formed on the element substrate 10. The transparent substrate 20 includes a second opposing surface 21 that faces the first opposing surface 11. The transparent substrate 20 is disposed with the second opposing surface 21 facing the first opposing surface 11 of the element substrate 10 so as to cover the display region 13 and the peripheral region 14. As the transparent substrate 20, for example, any substrate having transparency such as a glass substrate, an $SiO_2$ substrate, or an acrylic substrate may be used.

The color filter layer 30 is a layer including a color filter that transmits light having a predetermined wavelength. The color filter layer 30 includes a plurality of color filters that transmits light beams having different wavelengths from each other. The color filter layer 30 is disposed between the element substrate 10 and the transparent substrate 20 so as to overlap in plan view with the display region 13 and the peripheral region 14.

In this embodiment, a colored filter portion 31 is constituted by the color filter disposed so as to overlap with the display region 13 in plan view. Further, a light shielding filter portion 32 is constituted by the color filter disposed so as to overlap with the peripheral region 14 in plan view. In FIG. 1, the colored filter portion 31 overlapping with the display region 13 is illustrated as a dark gray region, and the light shielding filter portion 32 overlapping with the peripheral region 14 is illustrated as a light gray region. The colored filter portion 31 and the light shielding filter portion 32 will be described later in detail.

Figure 2:
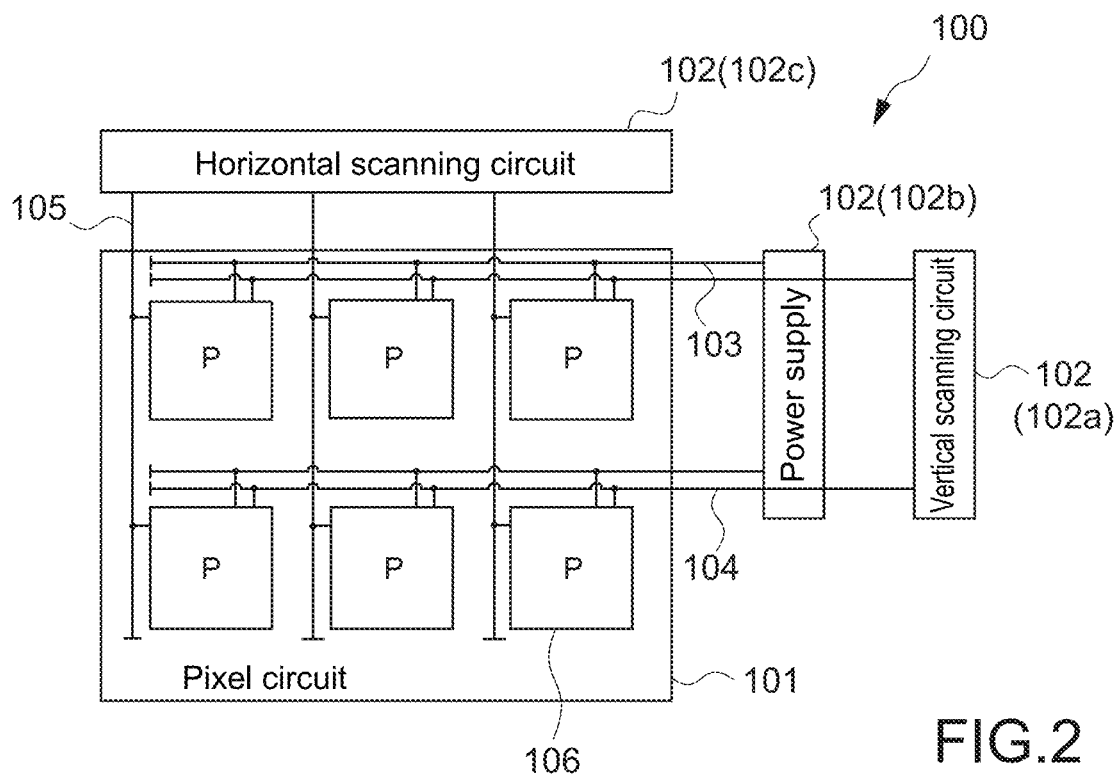
FIG. 2 is a block diagram showing an overall configuration example of the display device.

Here, the circuit configuration of the display device 100 will be described. FIG. 2 is a block diagram showing an overall configuration example of the display device 100. The display device 100 includes a pixel array 101 including the plurality of pixels P, and a drive unit 102 that drives the pixel array 101. The pixel array 101 is provided on the element substrate 10 so as to overlap with the display region 13 shown in FIG. 1. The drive unit 102 is provided on the element substrate 10 so as to overlap with the peripheral region 14.

The pixel array 101 includes the plurality of pixels P arranged in a matrix, and a power supply line 103 arranged to correspond to each row of the plurality of pixels P. Each pixel P includes a pixel circuit 106 disposed at a portion where a row-like scanning line 104 and a column-like signal line 105 intersect with each other.

The drive unit 102 includes a vertical scanning circuit 102a, a power supply 102b, and a horizontal scanning circuit 102c. The vertical scanning circuit 102a sequentially supplies a control signal to each scanning line 104 to sequentially scan each pixel P in units of rows. The power supply 102b supplies a constant power supply potential to each power supply line 103 to drive the pixel circuit 106 constituting the pixel P. When the power supply potential is made constant, it is possible to simplify the configuration of the power supply 102b, and to make the element size compact. The horizontal scanning circuit 102c supplies a signal potential serving as an image signal (video signal) and a reference potential to each signal line 105 in accordance with scanning by the vertical scanning circuit 102a.

In addition, the specific configuration of the drive unit 102 is not limited. For example, as the power supply 102b, a power supply scanner or the like may be used, which supplies a power supply potential at which a high potential and a low potential are switched to each other to each power supply line 103 in accordance with scanning by the vertical scanning circuit 102a. Thus, for example, even when the display device 100 is mounted on a medium-sized electronic apparatus (such as a smartphone) or a large-sized electronic apparatus (such as a television or a PC monitor), it is possible to stably drive the display device 100 while suppressing power consumption.

Figure 3:
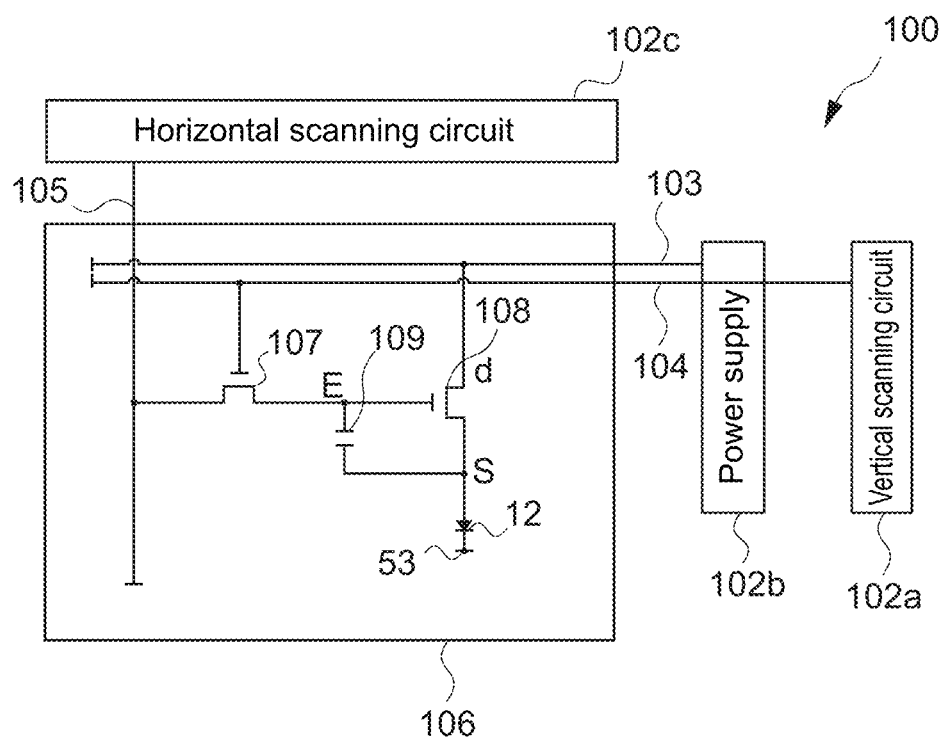
FIG. 3 is a circuit diagram showing a specific configuration example of a pixel circuit shown in FIG. 2.

FIG. 3 is a circuit diagram showing a specific configuration example of the pixel circuit 106 shown in FIG. 2. The pixel circuit 106 includes a diode that functions as the organic EL element 12, a sampling transistor 107, a driving transistor 108, and a holding capacitor 109.

A control terminal (gate) of the sampling transistor 107 is connected to the scanning line 104, one of the drive terminals (source and drain) is connected to the signal line 105, and the other one is connected to a control terminal of the driving transistor 108. One of the drive terminals of the driving transistor 108 is connected to the anode of the organic EL element 12, and the other one is connected to the power supply line 103. Further, the cathode of the organic EL element 12 is connected to a common electrode common to the plurality of organic EL elements 12 (see FIG. 4). The holding capacitor 109 is connected between the control terminal of the driving transistor 108 and the anode of the organic EL element 12, and holds the signal potential of the image signal supplied from the signal line 105.

Figure 4:
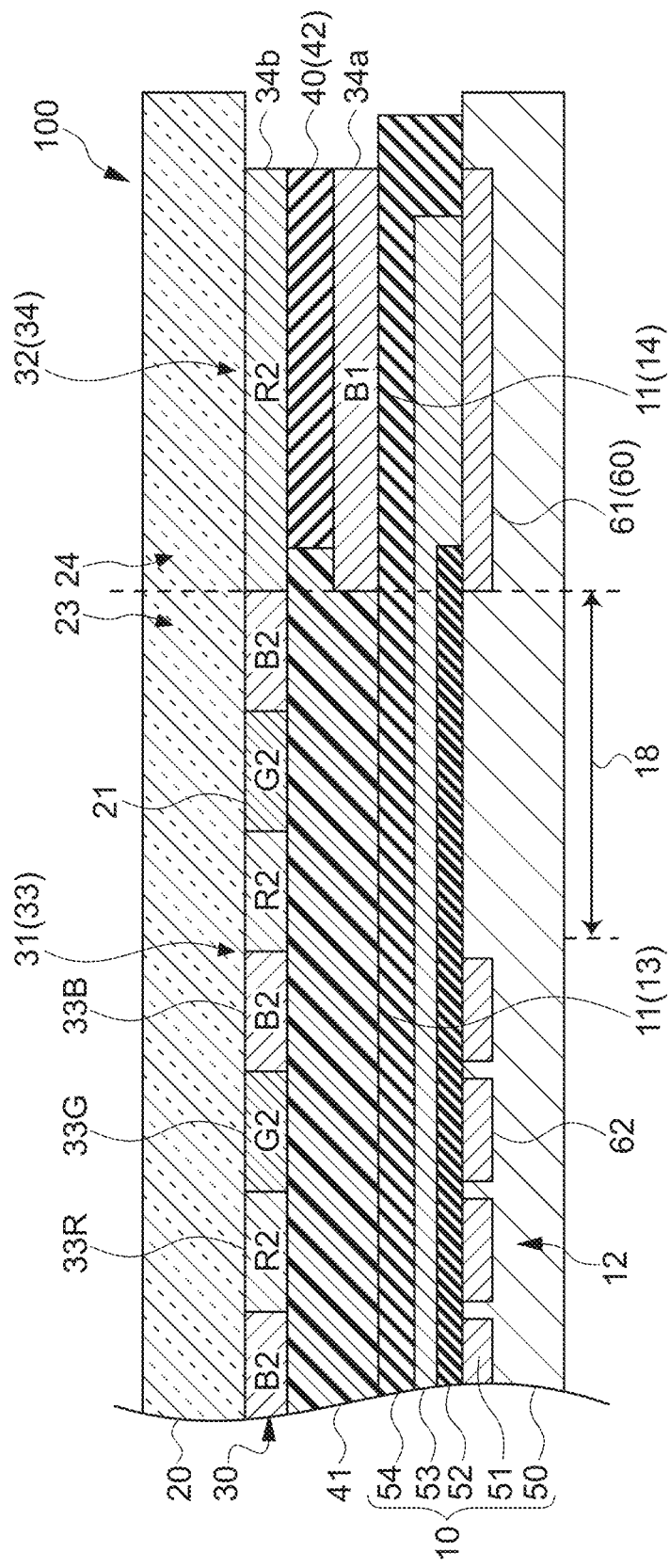
FIG. 4 is a schematic diagram showing an example of a cross-sectional structure of the display device.

FIG. 4 is a schematic view showing an example of a cross-sectional structure of the display device 100. FIG. 4 schematically shows a schematic cross-sectional structure of the display device 100 taken along the line AA' shown in FIG. 1. Hereinafter, a portion corresponding to the display region 13 of the display device 100 may be referred to as a display portion 23, and a portion corresponding to the peripheral region 14 may be referred to as a peripheral portion 24. The dotted line in the drawing is a line representing the boundary between the display region 13 and the peripheral region 14. The left side of the dotted line corresponds to the cross-sectional structure in the display portion 23 (display region 13), and the right side of the dotted line corresponds to the cross-sectional structure in the peripheral portion 24 (peripheral region 14).

The display device 100 includes the element substrate 10, the transparent substrate 20, and the color filter layer 30 as described above. Further, the display device 100 includes a transparent adhesive layer 40 and a filler 41. Hereinafter, the arrangement of each component may be referred to as a lower layer or an upper layer in accordance with the vertical direction in the drawing. Note that the description of the lower layer or the upper layer represents a relative positional relationship and it is not intended to limit the direction or the like of the display device 100.

The element substrate 10 includes a circuit layer 50, a metal electrode layer 51, an organic light emitting layer 52, a common electrode 53, and a protective film 54. In this embodiment, the surface of the protective film 54 facing the transparent substrate 20 serves as the first opposing surface 11. Therefore, the display region 13 and the peripheral region 14 described above are regions on the protective film 54.

The circuit layer 50 is configured by stacking a circuit for driving the organic EL elements 12 on the substrate. As the substrate, for example, a semiconductor substrate formed of Si or the like, a glass substrate, an acrylic substrate, or the like is used. Alternatively, a metal substrate formed of stainless steel or the like, a plastic film, or the like may be used as the substrate.

For example, the display portion 23 of the circuit layer 50 includes a circuit including elements constituting the pixel circuit 106 shown in FIG. 3 (sampling transistor 107, driving transistor 108, holding capacitor 109, etc.), various types of wiring connected to the organic EL elements 12 (power supply line 103, scanning line 104, signal line 105, etc.). In the peripheral portion 24 of the circuit layer 50, for example, the drive unit 102 shown in FIG. 3 (vertical scanning circuit 102a, power supply 102b, and horizontal scanning circuit 102c) is stacked. Note that FIG. 1 omits illustration of wiring, elements, and the like stacked on the circuit layer 50. The specific configuration of the circuit layer 50 is not limited. A circuit for driving the organic EL elements 12, or the like may be appropriately stacked.

The metal electrode layer 51 is a layer constituting an electrode formed of a metal film. In this embodiment, the circuit layer 50 and the metal electrode layer 51 constitute the element substrate 10 of the display device 100. The metal electrode layer 51 is formed, for example, as one wiring layer in the circuit layer 50. In this embodiment, the metal electrode layer 51 is stacked on the uppermost layer of the circuit layer 50.

As shown in FIG. 4, the metal electrode layer 51 includes a cathode contact 61 disposed in the peripheral portion 24. The cathode contact 61 (metal electrode layer 51) is disposed on the uppermost layer of the circuit layer 50, and is thus the metal film closest to the color filter. Further, the drive unit 102 and the like described above are stacked in the lower layer of the cathode contact 61. In this embodiment, the drive unit 102 and the cathode contact 61 constitute the peripheral wiring 60 shown in FIG. 1.

The cathode contact 61 is an electrode that is electrically connected to the common electrode 53 (see FIG. 3) serving as the cathode of the organic EL element 12. The cathode contact 61 is connected to, for example, a predetermined reference potential (typically, GND potential) and supplies the reference potential to the common electrode 53. In the example shown in FIG. 4, the cathode contact 61 is formed from the boundary between the display portion 23 and the peripheral portion 24 to the vicinity of the end portion of the circuit layer 50. Thus, a sufficient contact area with the common electrode 53 can be ensured, and the contact resistance can be lowered. As a result, the reference potential can be stably supplied to the common electrode 53.

Further, the metal electrode layer 51 includes pixel electrodes 62 disposed in the display portion 23. The pixel electrodes 62 are the anode electrodes of the respective organic EL elements 12 and are disposed to correspond to the plurality of pixels P. In FIG. 4, a plurality of pixel electrodes 62 disposed to correspond to the plurality of pixels P is schematically illustrated. Each pixel electrode 62 is appropriately connected to the wiring of the pixel circuit 106 formed in the circuit layer 50.

Note that, at the outer edge of the display portion 23 (display region 13), a dummy region 18 is provided in which pixels (dummy pixels) that are not used in the actual image display are formed. The dummy region 18 is, for example, a buffer region for equalizing the film forming conditions or the like of the pixels used in the actual image display. In the dummy region 18, only the pixel pattern of the color filter is formed, and the pixel electrode 62 is not disposed, for example, as shown in FIG. 4. The specific configuration of the dummy region 18 is not limited.

In this embodiment, the pixel electrode 62 is a reflective electrode and functions as a metal reflective film for reflecting light of the organic EL element 12. In other words, the metal reflective film constitutes the pixel electrode 62. As will be described later, the organic light emitting layer 52 is stacked on the pixel electrode 62. Therefore, the pixel electrode 62 reflects the light generated by the organic light emitting layer 52 to the first opposing surface 11. This makes it possible to reflect light traveling toward the circuit layer 50 and emit the light from the first opposing surface 11, for example, and to sufficiently improve the luminous efficiency of the organic EL element 12.

In such a manner, the metal electrode layer 51 is stacked such that the pixel electrode 62 functions as the metal reflective film. Therefore, the cathode contact 61 constituted by the metal electrode layer 51 also becomes a metal reflective film having the same reflectance as that of the pixel electrode 62.

As a metal material constituting the metal electrode layer 51, a metal having light reflectivity such as aluminum (Al) or silver (Ag) is used. Alternatively, an alloy of a metal having light reflectivity, or the like may be used. For example, the light reflectance of the metal electrode layer 51 is set to, for example, 40% or more, and more preferably 80% or more. Thus, it is possible to sufficiently enhance the luminous efficiency of the organic EL element 12. In addition, the material, reflectance, or the like of the metal electrode layer 51 is not limited.

The organic light emitting layer 52 is a layer that emits light by recombination of the holes supplied from the anode electrode (pixel electrode 62) and the electrons supplied from the cathode electrode (common electrode 53). The organic light emitting layer 52 is configured to emit white light, for example.

In the organic light emitting layer 52, for example, a hole injection layer, a hole transport layer, a light emitting layer, an electron transport layer, and an electron injection layer are stacked in this order from the pixel electrode 62. The light emitting layer has a structure in which, for example, light emitting layers corresponding to R, G, and B of a red light emitting layer, a blue light emitting layer, and a green light emitting layer are stacked. As a result, the light emitting layer emits white light.

The hole injection layer (electron injection layer) is a buffer layer that enhances the efficiency of injecting holes (efficiency of injecting electrons) to the light emitting layer and prevents leakage. The hole transport layer (electron transport layer) is provided to enhance the efficiency of transporting holes (efficiency of transporting electrons) to the light emitting layer. The hole injection layer, the hole transport layer, the electron injection layer, and the electron transport layer can be formed of various materials generally used.

In the light emitting layer, light having a predetermined wavelength is emitted according to the material of the light emitting layer by recombination of electrons and holes. Examples of the material constituting the light emitting layer include polyfluorene-based polymer derivatives, (poly)paraphenylene vinylene derivatives, polyphenylene derivatives, polyvinylcarbazole derivatives, polythiophene derivatives, perylene-based dyes, coumarin-based dyes, rhodamine-based dyes, or a material obtained by doping an organic EL material into these polymers. Note that the light emitting layer may also serve as the above-mentioned hole transport layer or electron transport layer.

The organic light emitting layer 52 is formed on the circuit layer 50 by, for example, a vacuum vapor deposition method so as to cover each pixel electrode 62. The specific configuration of the organic light emitting layer 52 is not limited. For example, the material of each layer may be appropriately selected such that light having a desired wavelength can be emitted.

The common electrode 53 is a transparent electrode stacked on the organic light emitting layer 52. As shown in FIG. 4, the common electrode 53 is disposed so as to cover the entire surface of the display portion 23. Also in the peripheral portion 24, the common electrode 53 is disposed on the cathode contact 61. As a result, the common electrode 53 and the cathode contact 61 are electrically connected to each other, and the reference potential (GND potential) is supplied to the common electrode 53.

The common electrode 53 is formed of a transparent conductive film having good light transmittivity and low reflectance. For example, when a transparent conductive film is formed using an oxide, it is possible to constitute a common electrode 53 having good light extraction efficiency. In this case, ZnO, ITO, IZnO, InSnZnO, or the like is used as the common electrode 53.

The common electrode 53 may be formed of a single layer or may be formed by stacking a plurality of films having different functions. For example, the common electrode 53 may be formed by stacking a light-transmitting film having low reflectance and high transmittivity, a transparent conductive film having high conductivity, a deterioration preventing film that prevents corrosion of the electrode, and the like in this order from the organic light emitting layer 52. Thus, the common electrode 53 having high light transmission efficiency and corrosion resistance is provided. The common electrode 53 is formed by, for example, a deposition method such as a vacuum vapor deposition method, a sputtering method, or a plasma chemical vapor deposition (CVD) method. In addition, the specific configuration of the common electrode 53 is not limited.

In such a manner, the organic EL element 12 includes the transparent common electrode 53 disposed on the first opposing surface 11 side of the element substrate 10, the pixel electrode 62 disposed on the side opposite to the first opposing surface 11 of the common electrode 53, and the organic light emitting layer 52 disposed between the common electrode 53 and the pixel electrode 62. Thus, the top emission type organic EL element 12 that emits light from the common electrode 53 is configured in the display device 100.

The configuration of the organic EL element 12 is not limited. For example, an organic EL element 12 having a cavity structure (resonating structure) may be configured. In the cavity structure, for example, a common electrode 53 having semi-transmittivity and semi-reflectivity is used. Thus, the light emitted from the organic light emitting layer 52 can be subjected to multiple interference between the pixel electrode 62 and the common electrode 53. In this case, light having a predetermined wavelength intensified by the multiple interference is emitted from the common electrode 53.

In the cavity structure, light having a wavelength corresponding to an optical distance between the pixel electrode 62 and the common electrode 53 is emitted. Thus, for example, when the thickness of the pixel electrode 62 is appropriately adjusted, it is possible to extract light having a desired wavelength. This makes it possible to improve the light extraction efficiency in the organic EL element 12 and to control the emission spectrum.

Further, the organic EL elements 12 capable of respectively emitting red light, green light, and blue light may be configured. For example, using the cavity structure described above, the organic EL elements 12 that emit light beams of the respective colors of R, G, and B can be configured. Alternatively, the organic EL elements 12 that emit light beams of the respective colors of R, G, and B may be configured by respectively stacking the organic light emitting layers 52 that emit red light, green light, and blue light.

The protective film 54 is a transparent film having light transmittivity for protecting the organic EL element 12 from moisture, oxygen, and the like present in the atmosphere. The protective film 54 is formed so as to cover the common electrode 53. The example shown in FIG. 4 schematically shows the protective film 54 formed from the display portion 23 to the peripheral portion 24 so as to cover the entire surface of the common electrode 53.

The protective film 54 is formed using, for example, an inorganic compound. As the inorganic compound, $SiO_x$ (silicon oxide), $SiN_x$ (silicon nitride), $SiO_xN_y$ (silicon oxide nitride), $Al_xO_y$ (aluminum oxide), and the like, which have high barrier property to moisture or oxygen, are used. The films of these inorganic compounds are formed by, for example, a vacuum vapor deposition method, a sputtering method, a CVD method, or an ion plating method.

Note that the protective film 54 may be formed of a single layer or may be formed by stacking a plurality of films. For example, when the element substrate 10 is actually configured, the surface of the organic EL element 12 or the like (common electrode 53) may include irregularities. So, for the purpose of improving the accuracy of stacking the color filter to be disposed on the upper layer, or the like, the protective film 54 may be planarized. Note that FIG. 4 schematically shows the interface of the circuit layer 50 (metal electrode layer 51), the interface of the cathode contact 61, or the like as a plane.

In the case of planarizing the protective film 54, for example, a planarizing film is provided between the layers formed of an inorganic compound. As the planarizing film, for example, a resin material (epoxy resin, urethane resin, silicon resin, or the like) having transparency and having thermosetting property or ultraviolet curable property is used. These resins are appropriately applied onto a layer previously stacked and formed of an inorganic compound. Then, the resin material is cured, and an inorganic compound is newly stacked. Thus, it is possible to form the first opposing surface 11 in which irregularities or the like of the lower layer are mitigated.

The color filter layer 30 includes a plurality of color filters disposed between the element substrate 10 and the transparent substrate 20. Of the plurality of color filters, a color filter (colored filter 33) disposed on the upper layer of the display region 13 (display portion 23) constitutes the colored filter portion 31. Further, a color filter (light shielding filter 34) disposed on the upper layer of the peripheral region 14 (peripheral portion 24) constitutes the light shielding filter portion 32.

Each color filter of the color filter layer 30 is formed by stacking a plurality of colored films that allows light having different wavelengths to pass therethrough. Specifically, a red colored film that transmits red light having a wavelength of about 610 nm, a green colored film that transmits green light having a wavelength of about 550 nm, and a blue colored film that transmits blue light having a wavelength of about 470 nm are used.

Each colored film is formed using, for example, a photosensitive resin material (color resist) obtained by kneading a coloring material (dye or the like) exhibiting a predetermined color. For example, a color resist is applied onto a target surface (first opposing surface 11 or second opposing surface 21) by a spin coating method or the like, and a predetermined pattern is formed by a photolithography method. Subsequently, heat treatment such as baking for curing the color resist is performed.

These colored films are appropriately stacked on the first opposing surface 11 or the second opposing surface 21 to constitute a colored filter portion 31 (colored filter 33) and a light shielding filter portion 32 (light shielding filter 34). Hereinafter, the configurations of the colored filter portion 31 and the light shielding filter portion 32 will be described in detail with reference to FIG. 4.

The colored filter portion 31 includes a plurality of colored filters 33 that transmits light beams having different wavelengths to color the light of the organic EL elements 12. The colored filter 33 is a color filter disposed on the upper layer of the display region 13, that is, on the optical path of the light emitted from the organic EL element 12.

The plurality of colored filters 33 includes a first colored filter 33B, a second colored filter 33R, and a third colored filter 33G that transmit light beams having wavelengths different from each other. The first to third colored filters 33B, 33R, and 33G are color filters that convert the incident light into blue light, red light, and green light. Each colored filter 33 typically includes a single colored film.

In the embodiment shown in FIG. 4, each of the first to third colored filters 33B, 33R, and 33G is disposed on the second opposing surface 21 of the transparent substrate 20. That is, the first colored filter 33B includes a blue colored film B2 stacked on the second opposing surface 21, the second colored filter 33R includes a red colored film R2 stacked on the second opposing surface 21, and the third colored filter 33G includes a green colored film G2 stacked on the second opposing surface 21.

Further, each colored filter 33 is disposed on the second opposing surface 21 for each of the plurality of pixels P. For example, as shown in FIG. 4, on the second opposing surface 21, the first colored filter 33B, the third colored filter 33G, and the second colored filter 33R are repeatedly disposed in this order from the end of the display portion 23 (interface between the display portion 23 and the peripheral portion 24). Of those, the three colored filters 33B, 33G, and 33R disposed in the dummy region 18 constitute dummy pixels. Further, in the display portion 23 except the dummy region 18, each colored filter 33 is disposed so as to overlap with the pixel electrode 62 for each organic EL element 12. Note that the order or the like in which each colored filter 33 is disposed is not limited.

For example, white light emitted from the organic EL element 12 passes through each of the first to third colored filters 33B, 33R, and 33G and is then emitted as blue light, red light, and green light from the transparent substrate 20 disposed on the upper layer. In such a manner, the pixels in which the first to third colored filter 33B, 33R, and 33G are disposed function as sub-pixels that emit the respective color light beams. For example, when the output (light amount) of each organic EL element 12 corresponding to each pixel P is adjusted, it is possible to represent an arbitrary color.

Note that even when the organic EL elements 12 are configured to emit the respective color light beams, the emission spectra of the respective color light beams can be accurately adjusted by using the colored filters 33. In this case, for example, the organic EL element 12 is configured to emit the same color light as that of the corresponding colored filter 33. Thus, for example, even when there is unevenness or the like in the emission spectrum for each organic EL element 12, it is possible to accurately adjust the wavelengths of the respective color light beams emitted toward the transparent substrate 20 by passing the light through the colored filter 33. As a result, high-quality image display is made possible.

In FIG. 4, the case where all of the colored filters 33 are disposed on the transparent substrate 20 (second opposing surface 21) has been described. The configuration of the colored filter portion 31 is not limited to this. For example, all of the colored filters 33 may be disposed on the element substrate 10 (first opposing surface 11) (see FIG. 6). Alternatively, for example, among the plurality of colored filters 33, some of the colored filter 33 may be disposed on the first opposing surface 11, and the others of the colored filters 33 may be disposed on the second opposing surface 21 (see FIG. 7).

As described above, the colored filter portion 31 includes the plurality of colored filters 33, which is disposed on the first opposing surface 11 or the second opposing surface 21 and which transmits light beams having different wavelengths to color the light of the organic EL elements 12. Providing the colored filter portion 31 makes it possible to take out each color light beam of R, G, and B independently with high accuracy and to display a high-quality color image or the like. Other configurations of the colored filter portion 31 will be described later in detail.

The light shielding filter portion 32 includes a first light shielding filter 34a disposed in the peripheral region 14 of the first opposing surface 11, and a second light shielding filter 34b disposed on the second opposing surface 21 facing the first light shielding filter 34a. In this embodiment, the first light shielding filter 34a corresponds to a first color filter, and the second light shielding filter 34b corresponds to a second color filter.

In this embodiment, the second light shielding filter 34b is formed of a single colored film, and the first light shielding filter 34a is formed of a single colored film that transmits light having a wavelength different from that of the colored film forming the second light shielding filter 34b. That is, the first light shielding filter 34a and the second light shielding filter 34b are formed of single-layer colored films having colors different from each other.

The first and second light shielding filters 34a and 34b are each made as a single layer, and thus it is possible to reduce the film thickness thereof. As a result, peeling or the like of the light shielding filter 34, which occurs in the manufacturing process, can be sufficiently avoided and the yield can be improved.

Further, the first and second light shielding filters 34a and 34b are formed of colored films that transmit light having different wavelengths. Therefore, light passing through one of the light shielding filters 34 is restricted without passing through the other light shielding filter 34. That is, it can be said that the light shielding filter portion 32 is a light shielding structure formed on the upper layer of the peripheral wiring 60 (peripheral region 14) using the first and second light shielding filters 34a and 34b. Thus, the light shielding filter portion 32 shields the peripheral wiring 60 from light.

The first light shielding filter 34a is a color filter disposed on the upper surface of the element substrate 10 (first opposing surface 11). The region where the first light shielding filter 34a is provided is typically set so as to overlap in plan view with the peripheral wiring 60 such as the cathode contact 61 formed on the lower layer of the peripheral region 14. Note that the first light shielding filter 34a may be formed so as to be wider than the peripheral wiring 60 in plan view.

Further, the first light shielding filter 34a is configured to transmit light having the same wavelength as that of the first colored filter 33B. That is, the first light shielding filter 34a transmits blue light. For example, as shown in FIG. 4, the first light shielding filter 34a includes a blue colored film B1 stacked on the first opposing surface 11.

As the blue colored film B1, the same coloring material (color resist or the like) as that of the blue colored film B2 stacked on the second opposing surface 21 is used. Since it becomes possible to form films of the first light shielding filter 34a and the first colored filter 33B (blue colored films B1 and B2) using the same coloring material, it is possible to simplify the management of the coloring material or the like.

The second light shielding filter 34b is a color filter disposed on the lower surface of the transparent substrate 20 (second opposing surface 21) so as to face the first light shielding filter 34a. The region where the second light shielding filter 34b is provided is typically set so as to overlap in plan view with the first light shielding filter 34a. Note that the first and second light shielding filters 34a and 34b are disposed at predetermined intervals from each other.

Further, the second light shielding filter 34b is configured to transmit light having the same wavelength as that of the second colored filter 33R. That is, the second light shielding filter 34b transmits red light. For example, as shown in FIG. 4, the second light shielding filter 34b includes a red colored film R2 stacked on the second opposing surface 21.

As described above, the red colored film R2 is a colored film constituting the second colored filter 33R. Therefore, in the embodiment shown in FIG. 4, the second light shielding filter 34b is formed of the same colored film as that of the second colored filter 33R. In other words, the second light shielding filter 34b and the second colored filter 33R are formed at the same time when the red colored film R2 is formed.

As described above, the second light shielding filter 34b is formed by using the coloring material used for forming the second colored filter 33R. Thus, it is possible to constitute the second light shielding filter 34b without adding a new film forming step or the like. This makes it possible to simplify the manufacturing process.

Further, the second light shielding filter 34b passes ultraviolet light. When ultraviolet light passes through the second light shielding filter 34b, it becomes possible to use, for example, a UV curable adhesive that is cured by ultraviolet light or the like. This will be described later in detail.

In this embodiment, a colored film that transmit ultraviolet light is used as the red colored film R2. This makes it possible to easily constitute the second light shielding filter 34b that allows ultraviolet light to pass therethrough. Ultraviolet light is light (invisible light) whose wavelength falls within the wavelength range of approximately 10 nm to 400 nm. A colored film that transmits the light in this wavelength range and the red light is used as the red colored film R2. In this embodiment, the wavelength of the ultraviolet light corresponds to a predetermined wavelength, and the ultraviolet light corresponds to light having a predetermined wavelength.

In general, the coloring material that transmits the red light is often material capable of transmitting ultraviolet light, as compared to coloring materials that transmit other colored light (blue light or green light). Therefore, using a material that transmits red light (red colored film R2), it is possible to constitute the second light shielding filter 34b that reliably allows ultraviolet light to pass therethrough.

In FIG. 4, of the first and second light shielding filters 34a and 34b included in the light shielding filter portion 32, the second light shielding filter 34b is formed using the same colored film (red colored film B2) as the colored filter portion 31 (second colored filter 33R).

For example, when all of the colored filters 33 are disposed on the first opposing surface 11 of the element substrate 10 (see FIG. 6), the first light shielding filter 34a is formed using the same colored film as the first colored filter 33B. Further, for example, the first and second colored filters 33B and 33R are disposed on the first opposing surface 11 and the second opposing surface 21, respectively (see FIG. 7) In this case, the first and second light shielding filters 34a and 34b are formed of the same colored films as the first and second colored filter 33B and 33R, respectively.

As described above, at least one of the first light shielding filter 34a or the second light shielding filter 34b is formed of one of the plurality of colored films forming the plurality of colored filters 33. That is, the first and second light shielding filters 34a and 34b are formed by combination with the same color resist (colored film) of each of the colored filters 33. Thus, in the display device 100, the color resist for each pixel P is formed as a film so as to overlap with the peripheral region 14, so that the peripheral wiring 60 is shielded from light. As a result, for example, the number of film forming steps can be reduced, and the manufacturing process can be sufficiently simplified.

The transparent adhesive layer 40 is provided between the first and second light shielding filters 34a and 34b to bond the element substrate 10 and the transparent substrate 20 to each other. For example, an adhesive to be the transparent adhesive layer 40 is applied onto the light shielding filter 34 of one substrate, and the other substrate is bonded in this state. Therefore, the display device 100 has a structure in which the opaque element substrate 10 on which the color filter is formed and the transparent substrate 20 on which the color filter is formed are superimposed so as to sandwich the transparent adhesive layer (transparent resin) therebetween.

The thickness of the transparent adhesive layer 40 is adjusted, for example, such that the interval between the element substrate 10 and the transparent substrate 20 (substrate spacing) has a predetermined value. The substrate spacing is, for example, set such that light emitted from each organic EL element 12 properly enters a corresponding colored filter 33. For example, it is possible to set the substrate spacing according to the size of the pixel and the interval of the pixels. With such substrate spacing being maintained, the curing processing or the like of the transparent adhesive layer 40 is performed, so that the substrates are bonded to each other.

The transparent adhesive layer 40 (adhesive) is typically applied to surround the display region. In FIG. 1, an application region 16 to which the adhesive is to be applied is schematically illustrated using a hatched region. Providing such an application region 16 makes it possible to easily provide a filler 41 to be described later.

In this embodiment, the transparent adhesive layer 40 is a sealant 42 applied so as to surround the display region 13. The sealant 42 is an adhesive having transparency and is a sealing material for sealing the filler 41 provided in the display region 13. Further, the sealant 42 is a viscous paste-like material in an uncured state. For the application of the sealant 42, for example, a sealant application apparatus or the like is used, which supplies a paste-like sealant 42 from a dedicated nozzle to apply the sealant 42 with a predetermined width.

The transparent adhesive layer 40 (sealant 42) includes a photocurable adhesive that is cured by ultraviolet light. In other words, the transparent adhesive layer 40 is a UV curable adhesive. The type of the adhesive is not limited, and for example, an adhesive containing an epoxy resin or the like that is cured by ultraviolet light may be appropriately used. Further, for example, it is also possible to use a mixture of an adhesive that is cured by ultraviolet light and a thermosetting adhesive.

The filler 41 is a transparent resin material that is provided inside a region where the sealant 42 (transparent adhesive layer 40) is applied. The filler 41 is, for example, a material less viscous than the sealant 42 and capable of filling gaps or the like between the color filters without any gap. The filler 41 functions as a spacer and a protective layer between the transparent substrate 20 (colored filter portion 31) and the element substrate 10. and the element substrate 10.

Further, the filler 41 is an adhesive that is, for example, cured by predetermined curing processing to bond the transparent substrate 20 and the element substrate 10 to each other. In this case, the filler 41 functions as the transparent adhesive layer 40 similarly to the sealant 42. The type or the like of the filler 41 is not limited. For example, any resin material having transparency may be used as the filler 41.

[Manufacturing Process of Display Device 100]

Figure 5:
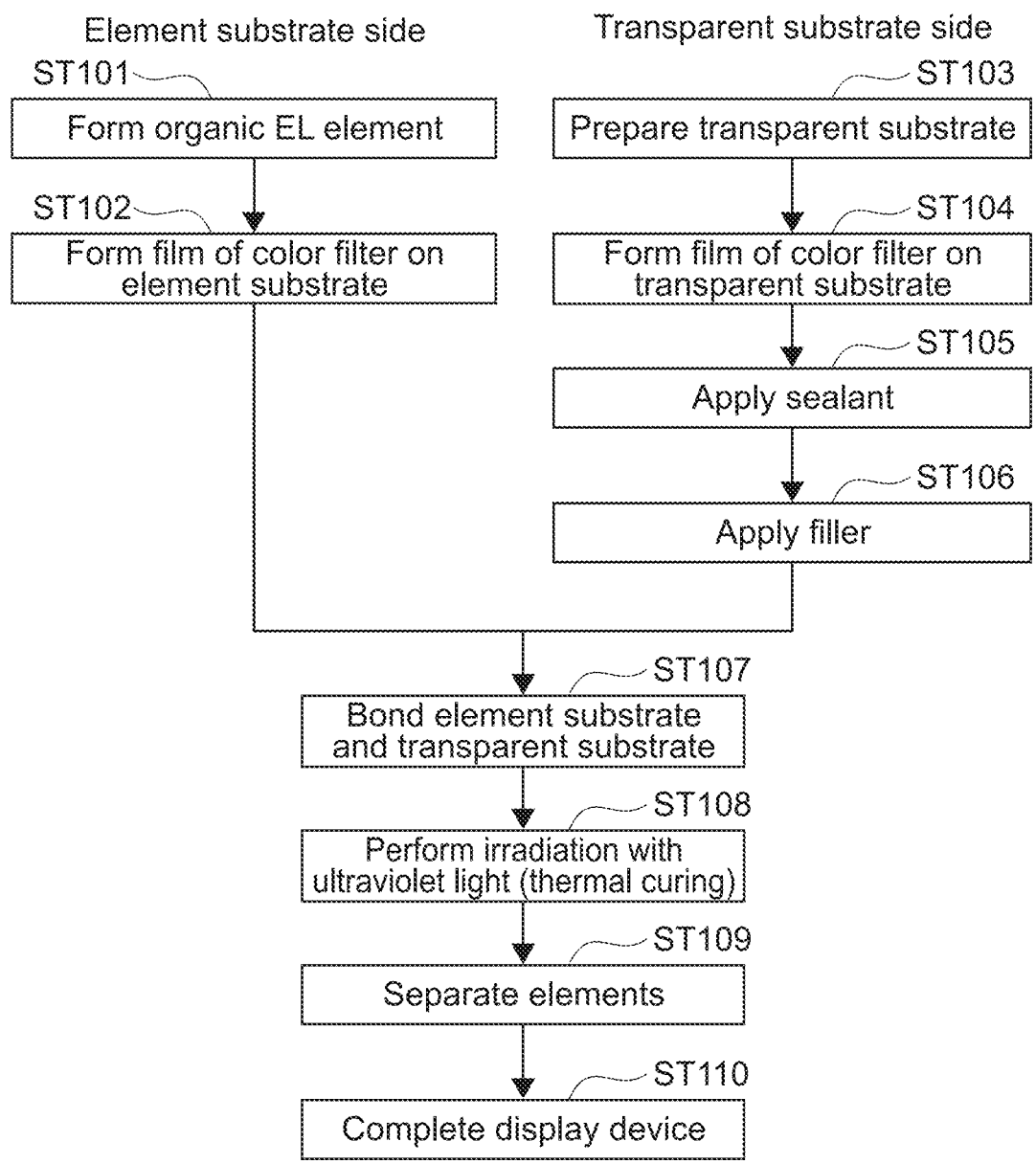
FIG. 5 is a manufacturing flowchart showing an example of a manufacturing process of the display device.

FIG. 5 is a manufacturing flowchart showing an example of the manufacturing process of the display device 100. As shown in FIG. 5, the manufacturing process of the display device 100 is roughly divided into three steps: the step of the element substrate 10 side (Steps 101 and 102); the step of the transparent substrate 20 side (Steps 103 to 106); and the step of manufacturing the display device 100 from the substrates (Steps 107 to 110). Note that the step of manufacturing the element substrate 10 side and the step of manufacturing the transparent substrate 20 side are independently performed.

First, the organic EL element 12 is formed on the element substrate 10 side (Step 101). For example, a predetermined substrate (Si substrate or the like) is prepared. In the following, it is assumed that a plurality of element substrates 10 (display device 100) is formed using one mother substrate.

The circuit layer 50, the metal electrode layer 51 (pixel electrode 62 and cathode contact 61), the organic light emitting layer 52, the common electrode 53, the protective film 54, and the like described with reference to FIG. 4 are appropriately stacked on the substrate. Thus, the plurality of organic EL elements 12 is formed on the substrate. The method of forming the organic EL element 12 is not limited, and various lithography methods, film formation methods, ion implantation methods, and the like may be appropriately used.

When the organic EL element 12 is formed, a color filter is formed on the element substrate 10 (Step 102). Specifically, a colored film constituting a necessary color filter (colored filter 33 or light shielding filter 34) is formed on the surface (first opposing surface 11) of the protective film 54 of the element substrate 10. In the example shown in FIG. 4, the blue colored film B1 constituting the first light shielding filter 34a is formed.

For example, a photosensitive resin material containing a blue dye (a blue color resist) is applied and formed into a pattern overlapping with the peripheral wiring 60 in plan view. Subsequently, curing processing such as heating is performed on the entire element substrate 10. Thus, the first light shielding filter 34*a* (blue colored film B1) is formed.

Note that the organic light emitting layer 52 is stacked on the element substrate 10 side. Therefore, the heating temperature at the time of curing the color resist is set within a range in which the characteristics of the organic EL material of the organic light emitting layer 52 do not change. The heating temperature of the color resist is thus set to a relatively low temperature.

After the color filter (first light shielding filter 34*a*) is formed on the element substrate 10, overcoat processing or the like for forming another film on the color filter is performed. In the overcoat processing, for example, a transparent planarizing film, a base film (primer) for improving adhesion to the sealant 42, or the like is formed. In FIG. 4, a planarizing film or the like formed by the overcoat processing is not illustrated. For example, a planarizing film, a base film, or the like is formed by a spin coating method or the like. Note that the overcoat processing may not be performed.

Next, the step of the transparent substrate 20 side will be described. On the transparent substrate 20 side, first, a transparent substrate 20 is prepared (Step 103). For example, a transparent substrate 20 having the same size as the mother substrate to form the element substrate 10 is cleaned and disposed in a predetermined film forming apparatus such as a spin coater.

A color filter is formed on the transparent substrate 20 (Step 104). Specifically, a colored film constituting a necessary color filter (colored filter 33 or light shielding filter 34) is formed on one surface (second opposing surface 21) of the transparent substrate 20. In the example shown in FIG. 4, the blue colored film B2 constituting the first colored filter 33B, the red colored film R2 constituting the second colored filter 33R and the second light shielding filter 34*b*, and the green colored film G2 constituting the third colored filter 33G are formed. There is no limitation on the order or the like in which each colored film is formed.

For example, a blue color resist is applied, and a pattern of the first colored filter 33B is formed. Next, a red color resist is applied, and patterns of the second colored filter 33R and the second light shielding filter are formed at the same time. Finally, a green color resist is applied, and a pattern of the third colored filter 33G is formed.

When each pattern is formed, the entire transparent substrate 20 is heated as the curing processing of the color resist. Alternatively, each time each pattern is formed, curing processing, semi-curing processing, or the like of the color resist may be performed.

Note that the transparent substrate 20 side does not include a material having low heat resistance, such as an organic EL material. Therefore, in the curing processing of the transparent substrate 20, the entire transparent substrate 20 is heated at a temperature at which each color resist can be sufficiently cured. As a result, it is possible to form a colored film that is sufficiently brought into contact with the transparent substrate 20 (second opposing surface 21). Thus, it is possible to avoid peeling or the like of each colored film.

After the color filters (first to third colored filters 33B, 33R, and 33G, and second light shielding filter 34*b*) are formed on the transparent substrate 20, overcoat processing or the like for forming another film on the color filter is performed. The overcoat processing is performed, for example, in the same manner as that of the element substrate 10 side. Note that the overcoat processing may not be performed.

When the color filters are formed, a sealant is applied (Step 105). For example, a UV curable sealant 42 is applied to the transparent substrate 20, on which the color filters are formed, by a sealant application apparatus or the like. The application region 16 of the sealant 42 is, for example, set so as to overlap with the second light shielding filter 34*b* (see FIG. 1). Further, the application amount of the sealant 42 is appropriately set in accordance with the substrate spacing between the element substrate 10 and the transparent substrate 20, the width of the second light shielding filter 34*b*, and the like.

After the sealant 42 is applied, the filler 41 is applied (Step 106). For example, a low viscous filler 41 is injected into a region surrounded by the sealant 42 that has already been applied. Thus, it is possible to apply the filler 41 so as to cover the colored filters 33. Note that the application amount of the filler 41 is appropriately set in accordance with the area of the display region 13, the substrate spacing, the film thickness of the colored filter, and the like.

The element substrate 10 and the transparent substrate 20 are bonded to each other (Step 107). In FIG. 5, the element substrate 10 is bonded to the transparent substrate 20 to which the sealant 42 and the filler 41 are applied. For example, with the transparent substrate 20 being disposed on the lower side, the element substrate 10 is caused to come close to the transparent substrate 20 from the upper side. At this time, alignment is performed such that the pattern of the color filter or the like on the transparent substrate 20 side and the pattern of the pixel P or the like on the element substrate 10 side properly overlap with each other.

The element substrate 10 and the transparent substrate 20 are fixed with a predetermined substrate spacing therebetween in a state where the alignment is completed. At this time, the sealant 42 is provided between the first and second light shielding filters 34*a* and 34*b*. Further, the filler 41 is provided between the first opposing surface 11 and the colored filter 33. A spacer or the like corresponding to the substrate spacing may be used for fixing each substrate.

The sealant 42 is irradiated with ultraviolet light for curing the sealant 42 (Step 108). For example, ultraviolet light is applied from the transparent substrate 20 side toward the sealant 42 provided in the peripheral portion 24. The ultraviolet light incident on the transparent substrate 20 enters the second light shielding filter 34*b*. As described above, the second light shielding filter 34*b* is formed of a colored film (red colored film R2) that transmits ultraviolet light. Therefore, the ultraviolet light passes through the second light shielding filter 34*b* and enters the sealant 42. Thus, the curing reaction of the sealant 42 proceeds, and the sealant 42 is cured.

The entire substrate may be irradiated with ultraviolet light. Thus, for example, it becomes possible to simultaneously cure a UV curable filler and the like. Further, the ultraviolet light may be selectively applied to the region to which the sealant 42 is applied. This makes it possible to suppress damage or the like to the organic light emitting layer due to irradiation with ultraviolet light. Note that, when a thermosetting adhesive is contained in the sealant 42 or the filler 41, or the like, thermosetting treatment is performed.

When the sealant 42 and the filler 41 are cured, the mother substrate is divided, and each element (display device 100) is separated (Step 109). The mother substrate to which the transparent substrate 20 is bonded is divided vertically and horizontally by a dicing device or the like and singulated into each element. Wiring, a package, or the like is connected to each element singulated, and the display device 100 is completed (Step 110).

[Description of Light Shielding Structure]

As shown in FIG. 4, in the display device 100, the color filters (first and second light shielding filters 34a and 34b) are stacked vertically across the sealant 42 in the upper layer of the peripheral region 14. Further, each color filter is set to selectively transmit light beams of colors different from each other. With this structure, the peripheral region 14 is shielded from light, and the peripheral wiring 60 disposed on the lower layer of the peripheral region 14 is shielded from light.

For example, it is assumed that white light is incident from the front of the display device 100 (the upper surface of the transparent substrate 20). In this case, white light passing through the transparent substrate 20 enters the second light shielding filter 34b in the peripheral portion 24. The second light shielding filter 34b transmits red light among the white light incident from the transparent substrate 20. The red light passes through the transparent adhesive layer 40 and enters the first light shielding filter 34a disposed on the lower layer.

The first light shielding filter 34a is a color filter that transmits blue light. So, the red light containing almost no spectral component of the blue light is substantially absorbed by the first light shielding filter 34a. As a result, external light such as white light incident through the light shielding filter portion 32 is sufficiently attenuated before reaching the peripheral wiring 60 (such as the cathode contact 61) disposed on the lower layer of the peripheral region 14, and the peripheral wiring 60 is shielded from light.

In such a manner, the first light shielding filter 34a limits the visible light passing through the second light shielding filter 34b. Thus, in the display device 100, the light shielding property of the periphery of the display region 13 is maintained at a high level. Thus, for example, even when external light or the like is incident from the transparent substrate 20 side, it is possible to sufficiently avoid a situation where unnecessary reflection, glare, or the like due to the peripheral wiring 60 occurs. As a result, high-quality image display can be achieved.

Figure 8A:
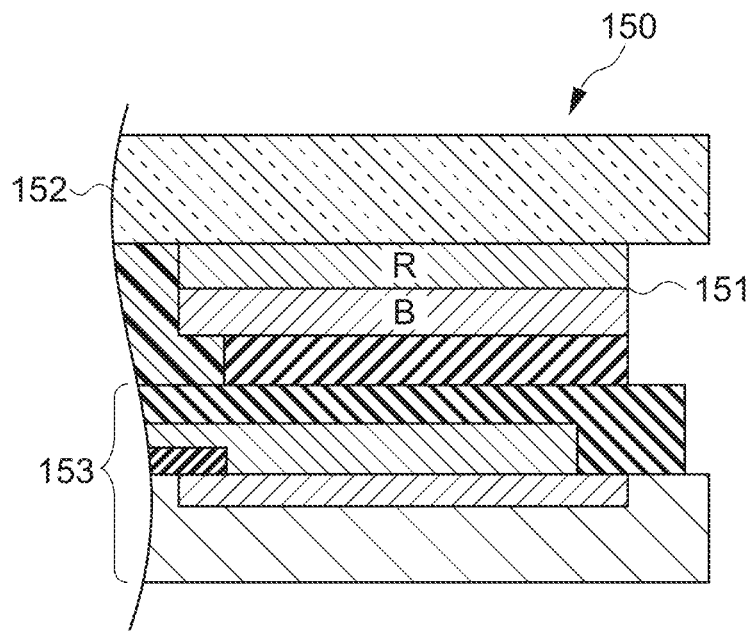
FIGS. 8A and 8B are schematic diagrams showing an example of a cross-sectional structure of a display device shown as a comparative example.
Figure 8B:
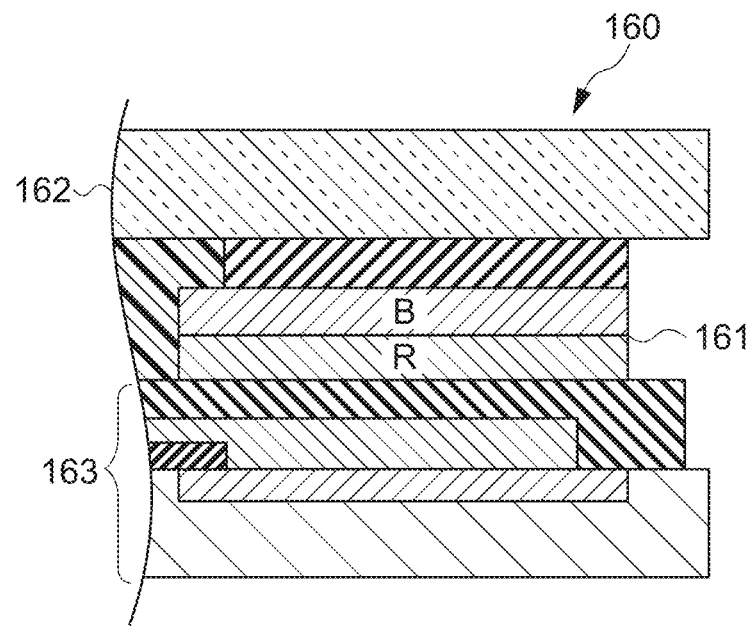

For example, even when a multilayer film including colored films that transmit light beams having different wavelengths and are directly stacked is disposed on one substrate, a filter that blocks visible light can be configured (see FIGS. 8A and 8B and the like). In contrast, in this embodiment, the first light shielding filter 34a and the second light shielding filter 34b are disposed separately into the element substrate 10 side and the transparent substrate 20 side, respectively. Thus, the thickness of the color filters (first and second light shielding filters 34a and 34b) disposed on the respective substrates can be thinned as compared with the case of using a multilayer film.

In this embodiment, the first and second light shielding filters 34a and 34b are each formed of a single-layer colored film. Therefore, the light shielding filter 34 is a light shielding film that is hardly peeled off and has high adhesion as compared with a thick film such as a multilayer film, for example. This makes it possible to sufficiently suppress peeling of the light shielding filter 34 or the like in a cleaning step, a high-temperature test, a high-humidity test, a cutting step, and the like performed after film formation. Using this light shielding structure in such a manner, it is possible to significantly improve the yield in the manufacturing process of the display device 100 while maintaining the light shielding property of the periphery of the display region.

After the light shielding filter 34 is formed, overcoat processing for providing a planarizing film, a primer, or the like thereon may be performed (see Steps 102 and 106 and the like in FIG. 5). Even in such a case, since the light shielding filter 34 is thin, it is possible to suppress the application failure or the like during spin coating. As a result, the overcoat film can be formed with high accuracy. Further, since peeling of the light shielding filter 34 or the like is suppressed, it is possible to improve the yield in the overcoat processing.

Further, when the light shielding structure is divided to have single-layer color filters, it becomes possible to achieve a structure that transmits ultraviolet light. Specifically, a colored film that transmits ultraviolet light is used as the second light shielding filter 34b. Thus, even when the sealant 42 is a UV curable adhesive, it becomes possible to properly irradiate the sealant 42 with ultraviolet light, and it is possible to avoid a curing failure or the like of the sealant 42.

In another point of view, it can be said that when the second light shielding filter 34b that transmits ultraviolet light is provided, it is possible to employ a UV curing type adhesive. This makes it possible to easily bond the transparent substrate 20 and the element substrate 10 to each other. In addition, a heating step for curing the sealant 42 or the like becomes unnecessary, and damage to the organic EL material can be suppressed.

The colored film constituting the second light shielding filter 34b is the red colored film R2 that transmits red light. Therefore, it is possible to transmit ultraviolet light efficiently as compared with the case where the colored films of other colors are used as the second light shielding filter 34b. Thus, it becomes possible to sufficiently cure the sealant 42 and to achieve highly reliable adhesiveness.

In the example shown in FIG. 4, the blue colored film B1 (first light shielding filter 34a) is disposed as a coloring side film facing the red colored film R2 (second light shielding filter 34b). In this case, since the spectra of the light passing through the respective colored films are separated from each other, it is possible to exhibit high light shielding performance.

Further, the sealant 42 for bonding each substrate is sandwiched between the first and second light shielding filters 34a and 34b. Since both the first and second light shielding filters 34a and 34b are formed of a resin material, the wettability (affinity) of the sealant 42 to these color filters is substantially the same. That is, the bonding step of the substrates, which is described in Step 107 or the like of FIG. 5, is performed in a state in which the sealant 42 is sandwiched between the materials having equal wettability.

Thus, it is possible to control the line width and the like of the sealant 42 with high accuracy. For example, when the substrates are attached to each other, the line width of the sealant 42 varies according to the substrate spacing. That is, as the substrate spacing becomes smaller, the sealant 42 is crushed by the color filters disposed on the upper and lower sides, and the line width is increased.

If the wettability of the bonding surface to come into contact with the sealant 42 is uneven, there is a possibility that a portion in which the line width of the sealant 42 widens greatly, a portion in which the line width does not change too much, or the like occurs. In this case, the boundary of the sealant 42 when viewed in plan view (outer and inner circumferences) is assumed to be wavy.

On the other hand, in this embodiment, the color filters formed of substantially the same material (photosensitive resin material) are disposed above and below the sealant 42. As a result, the line width at the time of bonding can be controlled with high accuracy, and, for example, a straight boundary or the like can be easily achieved. This makes it possible to bond the substrates uniformly. Further, since the boundary portion becomes less conspicuous, it is possible to suppress the visibility of the light shielding structure, and to improve the quality of the image display.

Note that, in the display device 100 shown in FIG. 4, all of the colored filters 33 are disposed on the second opposing surface 21 of the transparent substrate 20. Further, only the first light shielding filter 34*a* (blue colored film B1) is disposed on the first opposing surface 11 of the element substrate 10. As described above, the first light shielding filter 34*a* is cured at a relatively low temperature (see Step 102 of FIG. 5. For this reason, for example, moisture, oxygen, or the like may intrude from the interface between the first opposing surface 11 and the first light shielding filter 34*a*.

However, when all of the colored filters 33 are disposed on the transparent substrate 20 side as shown in FIG. 4, moisture or the like that has intruded from the interface between the first opposing surface 11 and the first light shielding filter 34*a* is blocked by the filler 41. This makes it possible to suppress deterioration of the organic EL element 12 or the like due to the intrusion of moisture or the like. As a result, it is possible to improve the reliability of the device.

Figure 6:
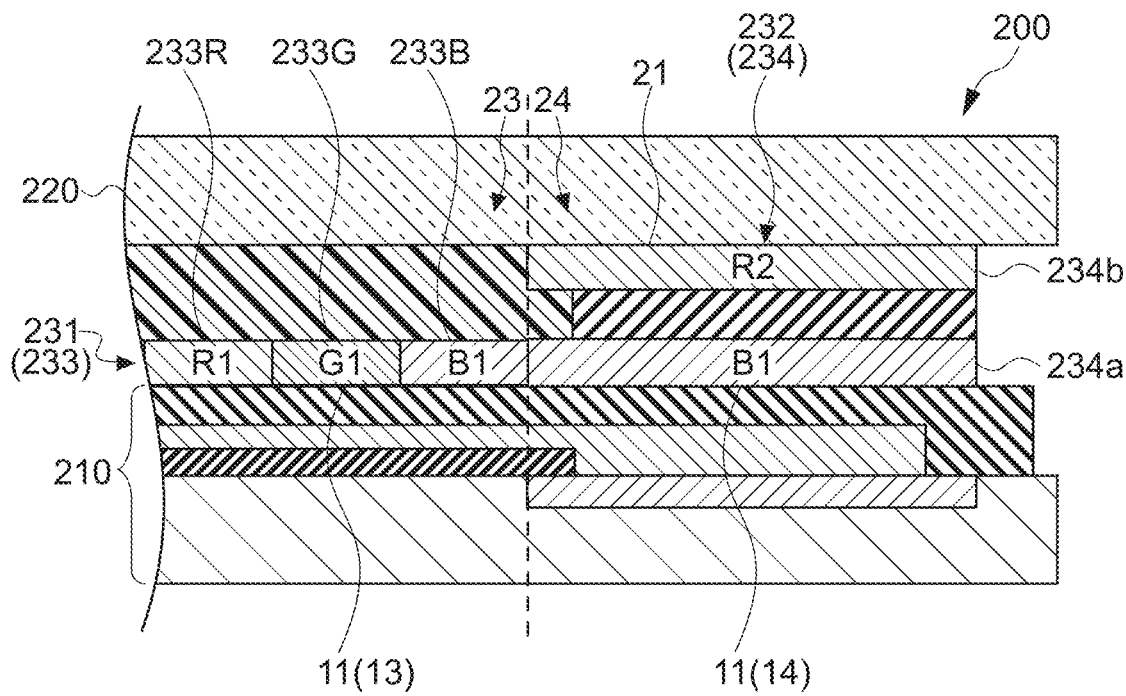
FIG. 6 is a schematic diagram showing another configuration example of the display device.

FIG. 6 is a schematic diagram showing another configuration example of the display device. In a display device 200 shown in FIG. 6, a plurality of colored filters 233 included in a colored filter portion 231 is all disposed on a first opposing surface 11 of an element substrate 210. Note that FIG. 6 schematically shows an example of a cross-sectional structure from a peripheral portion 24 of the display device 200 to a dummy region 18 that is an outer edge of the display portion 23.

The display device 200 includes the colored filter portion 231, a light shielding filter portion 232, the element substrate 210, and a transparent substrate 220. The element substrate 210 and the transparent substrate 220 are configured similarly to the element substrate 10 and the transparent substrate 20 of the display device 100 shown in FIG. 4, for example.

The colored filter portion 231 includes a first colored filter 233B, a second colored filter 233R, and a third colored filter 233G. Each of the first to third colored filters 233B, 233R, and 233G is disposed on the first opposing surface 11 of the element substrate 210. That is, the first colored filter 233B includes a blue colored film B1 stacked on the first opposing surface 11, the second colored filter 233R includes a red colored film R1 stacked on the first opposing surface 11, and the third colored filter 233G includes a green colored film G1 stacked on the first opposing surface 11.

The light shielding filter portion 232 includes a first light shielding filter 234*a* and a second light shielding filter 234*b*. The first light shielding filter 234*a* is disposed in the peripheral region 14 of the element substrate 210 (first opposing surface 11). The second light shielding filter 234*b* is disposed on the transparent substrate 220 (second opposing surface 21) so as to overlap with the first light shielding filter 234*a* in plan view. Each of the first and second light shielding filters 234*a* and 234*b* is formed of a single-layer colored film.

In the display device 200 shown in FIG. 6, the first light shielding filter 234*a* is formed of the same colored film as the first colored filter 233B. That is, the first light shielding filter 234*a* and the first colored filter 233B are simultaneously formed when the blue colored film B1 is stacked. Thus, the first light shielding filter 234*a* can be formed without adding a new film forming step or the like.

The second light shielding filter 234*b* is formed of a red colored film R2 stacked on the second opposing surface 21. As the red colored film R2, the same coloring material (color resist or the like) as that of the red colored film R1 stacked on the first opposing surface 11 is used.

As described above, when the first to third colored filters 233B, 233R, and 233G are disposed on the first opposing surface 11, the distance between each colored filter 233 and the organic EL element 12 can be reduced. Thus, for example, it is possible to avoid a situation where light emitted from one organic EL element 12 enters the colored filter 233 corresponding to an adjacent pixel P. As a result, it is possible to properly display a desired color and to achieve clear image display or the like.

Figure 7:
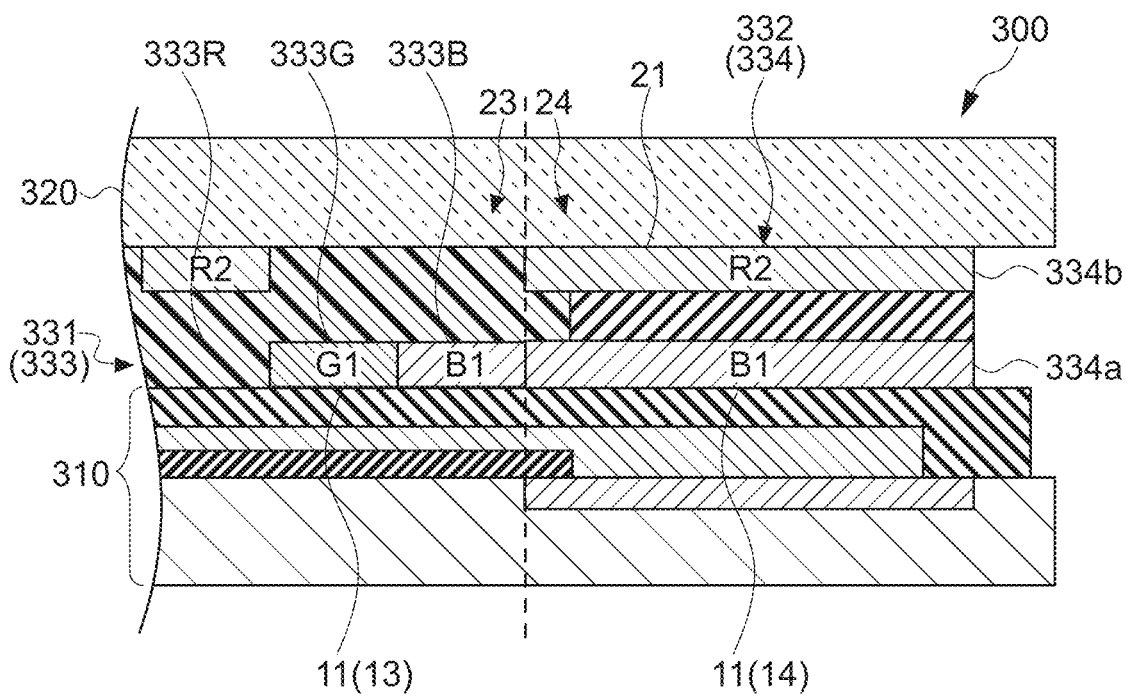
FIG. 7 is a schematic diagram showing another configuration example of the display device.

FIG. 7 is a schematic diagram showing another configuration example of the display device. In a display device 300 shown in FIG. 7, some of the plurality of colored filters 333 included in the colored filter portion 331 are disposed on a first opposing surface 11 of an element substrate 310, and others are disposed on a second opposing surface 21 of a transparent substrate 320.

The display device 300 includes a colored filter portion 331, a light shielding filter portion 332, the element substrate 310, and the transparent substrate 320. The element substrate 310 and the transparent substrate 320 are configured similarly to the element substrate 10 and the transparent substrate 20 of the display device 100 shown in FIG. 4, for example.

The colored filter portion 331 includes a first colored filter 333B, a second colored filter 333R, and a third colored filter 333G. In the display device 300, the first and third colored filters 333B and 333G are disposed on the first opposing surface 11 of the element substrate 310. Further, the second colored filter 333R is disposed on the second opposing surface 21 of the transparent substrate 320. That is, the first colored filter 333B includes a blue colored film B1 stacked on the first opposing surface 11, the second colored filter 333R includes a red colored film R2 stacked on the second opposing surface 21, and the third colored filter 333G includes a green colored film G1 stacked on the first opposing surface 11. Note that the third colored filter 333G may be disposed on the second opposing surface 21.

The light shielding filter portion 332 includes a first light shielding filter 334*a* and a second light shielding filter 334*b*. The first light shielding filter 334*a* is disposed in a peripheral region 14 of the element substrate 310 (first opposing surface 11). The second light shielding filter 334*b* is disposed on the transparent substrate 320 (second opposing surface 21) so as to overlap with the first light shielding filter 334*a* in plan view. Each of the first and second light shielding filters 334*a* and 334*b* is formed of a single-layer colored film.

In the display device 300 shown in FIG. 7, the first light shielding filter 334*a* is formed of the same colored film as the first colored filter 333B. That is, the first light shielding filter 334*a* and the first colored filter 333B are simultaneously formed when the blue colored film B1 is stacked.

Further, the second light shielding filter 334*b* is formed of the same colored film as the second colored filter 333R. That is, the second light shielding filter 334*b* and the second colored filter 333R are simultaneously formed when the red colored film R2 is stacked.

As described above, in the display device 300, a color filter (red colored film R2) that easily transmits ultraviolet light is formed on the upper substrate, and the other color filters are formed on the lower substrate. Thus, it is possible to properly cure the UV curable adhesive. Further, the peripheral color filters (first and second light shielding filters 334a and 334b) formed on the respective substrates are formed simultaneously when the corresponding colored filters are formed. This makes it possible to efficiently form a light shielding structure without adding a new step for forming a film of the light shielding filter or the like. As a result, it is possible to greatly shorten the time required for the manufacturing process or the like.

Hereinabove, in the display device 100 (200, 300) according to this embodiment, the first opposing surface 11 of the element substrate including the organic EL elements 12 and the peripheral wiring 60, and the second opposing surface 21 of the transparent substrate are disposed to face each other. The first and second light shielding filters are disposed to face each other on the first opposing surface 11 and the second opposing surface 21, respectively, and the peripheral wiring 60 is shielded from light. In addition, the element substrate and the transparent substrate are bonded to each other by the transparent adhesive layer provided between the light shielding filters. This makes it possible to reduce the thickness of each light shielding filter and to suppress the peeling or the like of the light shielding filter. As a result, it is possible to improve the yield while maintaining the light shielding property around the display region 13.

From the viewpoint of portability or the like, as a display panel to be mounted on a viewfinder, a head mount display, or the like, one having a smaller outer shape has been recently expected. So, a method of eliminating the outer frame, which has been generally adopted, and reducing the panel outer shape is developed. On the other hand, if the outer frame is eliminated, it is conceivable that light emitted from the panel, external light, or the like is reflected from the electrodes or the like disposed in the vicinity of the image, and the image quality is impaired.

The methods of shielding such electrodes disposed in the vicinity from light include a method of placing a light shielding film, in which a plurality of color filters is directly stacked, on the electrodes. In this case, the light shielding film is a multilayer film in which a plurality of color filters is stacked, and is a relatively thick film. In general, it is considered that as the total number of color filters to be stacked increases, the stacked films are peeled off, which may lower the yield of the manufacturing process.

FIGS. 8A and 8B are schematic diagrams showing an example of a cross-sectional structure of a display device shown as a comparative example. In a display panel 150 shown in FIG. 8A, a stacked structure 151 obtained by stacking red and blue color filters is stacked on a transparent upper substrate 152. Further, in a display panel 160 shown in FIG. 8B, the same stacked structure 161 as that in FIG. 8A is stacked on a lower substrate 163 including an organic EL or the like. In the display panels 150 and 160, these stacked structures 151 and 161 shield the peripheral electrodes from light. On the other hand, since the stacked structures 151 and 161 have a large film thickness, peeling or the like may occur during manufacturing.

Further, in the display panel 150 shown in FIG. 8A, the light is blocked by the stacked structure 151 when ultraviolet light or the like is applied from the upper substrate 152. For this reason, when a photocurable resin or the like is used for bonding the upper substrate 152 and the lower substrate 153, the photocurable resin is hardly irradiated with light, so that an uncured region may be generated. As a result, peeling or the like of the substrate may occur due to poor curing.

In the display panel 160 shown in FIG. 8B, a level difference due to the stacked structure 161 occurs on the surface of the lower substrate 162. This level difference may cause a problem in film formation such as overcoat processing. In addition, since the lower substrate 163 contains an organic EL material or the like, the adhesion between the stacked structure 161 and the lower substrate 163 is low. For this reason, the possibility of the peeling of the stacked structure 161 is increased by washing after the film formation of the stacked structure 161 or a high-temperature and high-humidity test, and the yield may be lowered.

In this embodiment, a structure in which a sealant is sandwiched between the first and second light shielding filters is used as a light shielding structure (light shielding filter portion) disposed in the peripheral region 14. That is, the color filters constituting the light shielding structure are separately disposed with the sealant interposed therebetween.

Thus, it is possible to reduce the film thickness of each of the first and second light shielding filters and to sufficiently increase the adhesion between the substrates. As a result, peeling of the first and second light shielding filters or the like can be avoided. As described above, in this embodiment, it is possible to greatly improve the yield of the manufacturing process while maintaining the light shielding property.

Further, the first and second light shielding filters are each formed of a single-layer colored film. As a result, even in the case of using the first light shielding filter that is cured at a relatively low temperature, for example, since the film thickness thereof is small, peeling or the like in the manufacturing process can be sufficiently suppressed. In addition, even in the case where overcoat processing or the like is performed on the element substrate side or the transparent substrate side, since the level difference in the peripheral portion is small, film formation processing can be properly performed.

In addition, for example, the second light shielding filter disposed on the upper layer can be configured as a filter capable of transmitting ultraviolet rays. Thus, it is possible to properly cure a UV curable sealant. Further, it is possible to sufficiently enhance the irradiation efficiency of ultraviolet light, with the second light shielding filter as a red color filter. This makes it possible to easily provide a highly reliable display device.

Note that the sealant is used so as to be sandwiched between the first and second light shielding filters. Therefore, when the element substrate and the transparent substrate are bonded to each other, the line width of the sealant can be controlled with high accuracy. Thus, reflection, glare, or the like by the peripheral wiring such as a cathode contact is avoided, and the peripheral portion 24 becomes less conspicuous. As a result, it is possible to achieve high-quality image display in which the visibility of the peripheral portion 24 is reduced.

Second Embodiment

A display device according to a second embodiment of the present technology will be described. In the following, descriptions of components similar to the configurations and functions of the display devices 100, 200, and 300 described in the above embodiment will be omitted or simplified.

Figure 9:
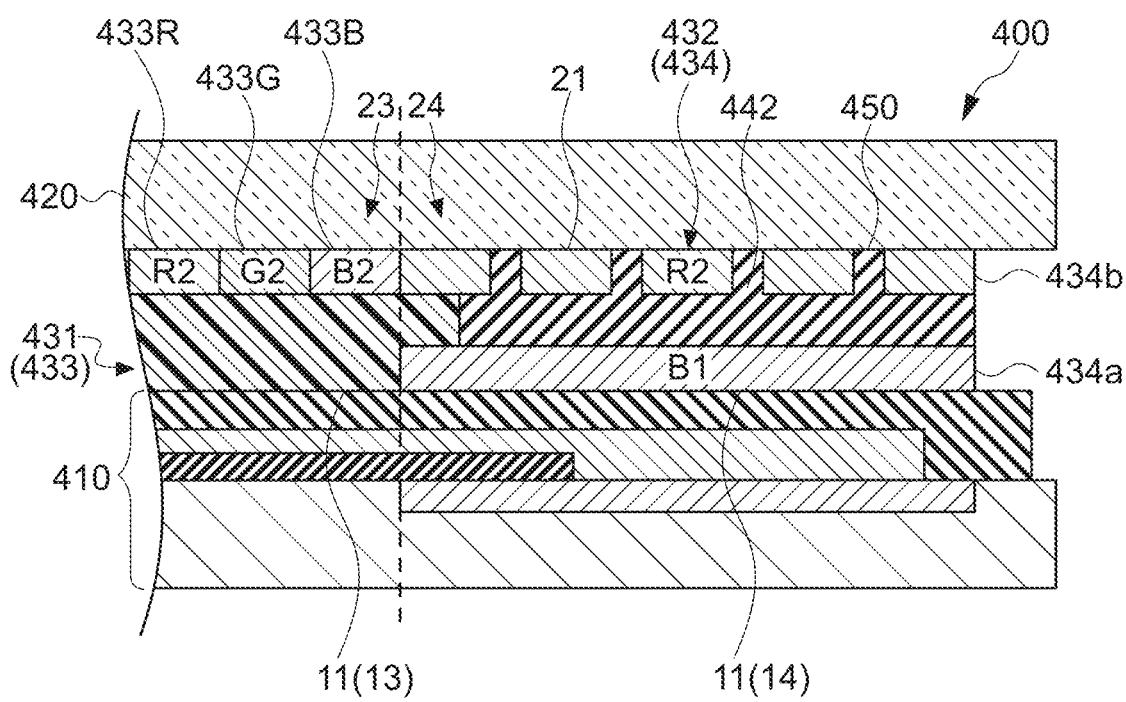
FIG. 9 is a schematic diagram showing a configuration example of a display device according to a second embodiment.

FIG. 9 is a schematic diagram showing a configuration example of a display device 400 according to the second embodiment. In the display device 400, a slit-shaped color filter (second light shielding filter 434b) is disposed in a peripheral portion 24 of a transparent substrate 420 side. Hereinafter, a colored filter portion 431 and a light shielding filter portion 432 of the display device 400 will be described.

The colored filter portion 431 includes a plurality of colored filters 433, all of which are disposed on the transparent substrate 420 side. In other words, the first to third colored filters 433B, 433R, and 433G are respectively constituted by a blue colored film B2, a red colored film R2, and a green colored film G2 stacked on a second opposing surface 21.

The light shielding filter portion 432 includes a first light shielding filter 434a disposed on the element substrate 410 side and a second light shielding filter 434b disposed on the transparent substrate 420 side. The first light shielding filter 434a is formed of a blue colored film B1 stacked on a first opposing surface 11. Further, the second light shielding filter 434b is formed of the same red colored film R2 as the second colored filter 433R.

As shown in FIG. 9, in the display device 400, the second light shielding filter 434b includes a plurality of openings 450 in which the second opposing surface 21 is exposed. The opening 450 is a region where a colored film (red colored film R2) is not formed, and functions as a window provided in the color filter. Each of the openings 450 is formed so as to be a band-shaped region surrounding the display region 13 (display portion 23) in plan view, for example. In this case, each of the openings 450 becomes a slit provided in the colored film. The first light shielding filter 434a is disposed so as to cover the peripheral region 14 of the first opposing surface 11. So, the first light shielding filter 434a is not provided with an opening structure such as a slit.

For example, when ultraviolet light is applied from the transparent substrate 420 side to the peripheral portion 24, part of the light passes through the red colored film R2, and the other part passes through the opening 450 and directly enters a sealant 442. The intensity of the ultraviolet light that has passed through the opening 450 is higher than that of the ultraviolet light that has passed through the red colored film R2, for example. When the plurality of openings 450 is provided in the second light shielding filter 434b in this manner, sufficient ultraviolet light can be applied from the transparent substrate 420, and the uncured state of the sealant 442 can be sufficiently suppressed.

In addition, since the first light shielding filter 434a having no opening structure is disposed on the lower layer of the second light shielding filter 434b, the light shielding property can be maintained. Thus, a light shielding structure capable of efficiently applying ultraviolet light to properly cure the sealant 442 is constituted.

Note that when the openings 450 are provided, a colored film or the like that is hard to transmit ultraviolet light can also be used as the second light shielding filter 434b. In other words, regardless of the transmission characteristics of the colored film, providing the openings 450 such as slits makes it possible to configure the second light shielding filter 434b that pass the ultraviolet light therethrough. Thus, for example, it is possible to freely select the configuration of the light shielding filter 434 in accordance with the design or the like of the colored filter 433, thus improving the degree of freedom in design.

The number, shape, size, or the like of the opening 450 is not limited. For example, the openings 450 forming the slits are arranged at equal intervals such that an application region in which the sealant 442 is applied can be uniformly irradiated with light. Further, the openings 450 may be formed as holes such as circular holes or rectangular holes and may be uniformly disposed on the colored film. Alternatively, an arbitrary aperture pattern capable of increasing the amount of irradiation of ultraviolet light while maintaining the light shielding property may be used.

Figure 10:
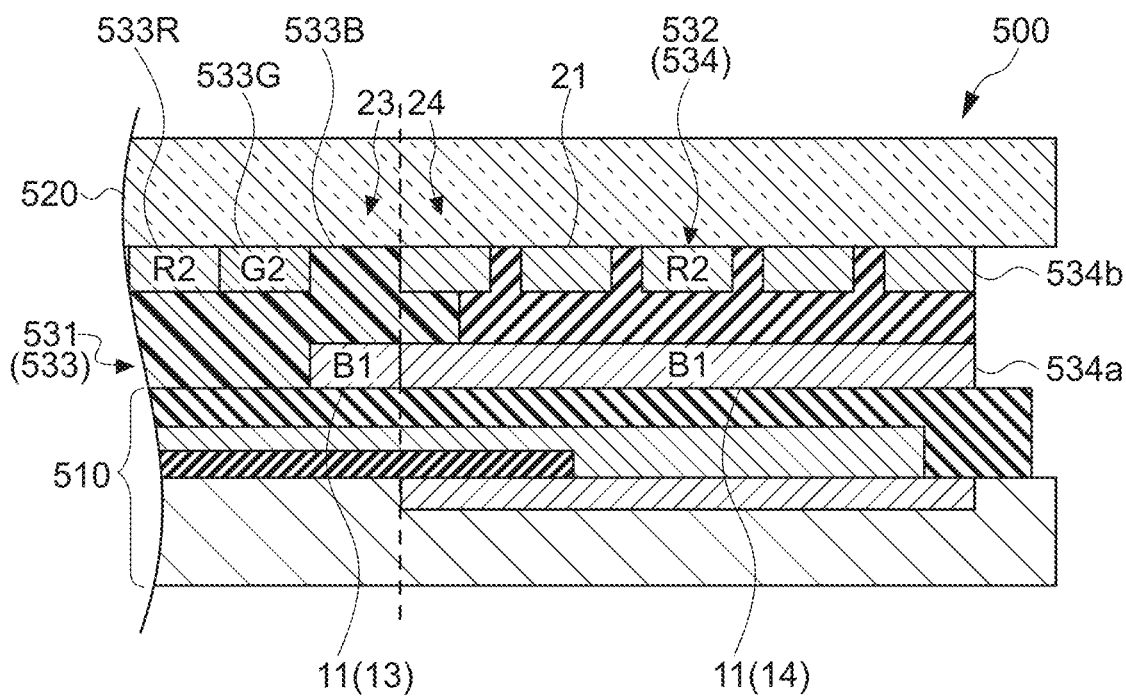
FIG. 10 is a schematic diagram showing another configuration example of the display device.

FIG. 10 is a schematic diagram showing another configuration example of the display device. In a display device 500 shown in FIG. 10, some of the plurality of colored filters 533 included in a colored filter portion 531 are disposed on an element substrate 510 side, and others are disposed on a transparent substrate 520 side. Further, the light shielding filter portion 532 is configured in substantially the same manner as that for the light shielding filter portion 432 shown in FIG. 9.

As shown in FIG. 10, a first colored filter 533B includes a blue colored film B1 stacked on a first opposing surface 11. Second and third colored filters 533R and 533G include a red colored film R2 and a green colored film G2 stacked on a second opposing surface 21, respectively. The third colored filter 533G may be disposed on the element substrate 510 side.

The first light shielding filter 534a is formed of the same blue colored film B1 as the first colored filter 533B, and the second light shielding filter 534b is formed of the same red colored film R2 as the second colored filter 533R. Thus, in the display device 500, each light shielding filter 534 can be simultaneously stacked when the colored filter 533 is stacked. In other words, the display device 500 has a structure in which each of the upper and lower color filters is a combination of the pixel P and the peripheral light shielding. Thus, it is possible to manufacture the display device 500 without adding a new film forming step or the like.

Note that all of the first to third colored filters 533B, 533R, and 533G may be disposed on the element substrate 510 side. In this instance, the first light shielding filter 534a is formed on the element substrate 510 simultaneously with the first colored filter 533B, and the second light shielding filter 534b is formed on the transparent substrate 520 alone. As described above, the light shielding filter can be formed appropriately in combination with a colored filter to be formed on each substrate.

Third Embodiment

Figure 11:
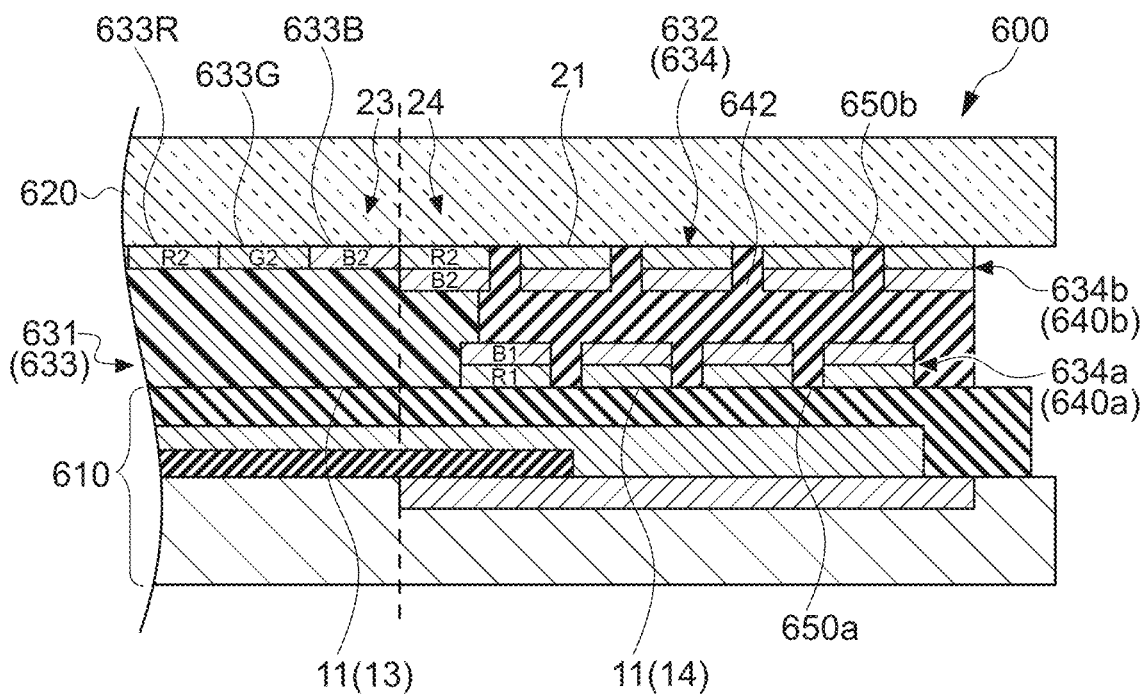
FIG. 11 is a schematic diagram showing a configuration example of a display device according to a third embodiment.

FIG. 11 is a schematic diagram showing a configuration example of a display device according to a third embodiment. In a display device 600 shown in FIG. 11, first and second light shielding filters 634a and 634b are formed using a stacked film having a two-layer structure. Note that, in FIG. 11, a colored film having a smaller film thickness than the colored film described in the above embodiments is described, but the present technology is not limited thereto. The film thickness of each colored film may be appropriately set.

A blue colored film B1 and a red colored film R1 are stacked on the element substrate 610 side. Further, a blue colored film B2, a red colored film R2, and a green colored film G2 are stacked on the transparent substrate 620 side. First to third colored filters 633B, 633R, and 633G of a colored filter portion 631 are formed of the blue colored film B2, the red colored film R2, and the green colored film G2, respectively. That is, the colored filter portion 631 is provided on the transparent substrate 620 side. In addition, four colored films excluding the green colored film G2 are used to form a light shielding filter portion 632 (first and second light shielding filters 634a and 634b).

As shown in FIG. 11, the first light shielding filter 634a is formed of the blue colored film B1 and the red colored film R1 that transmits light having a wavelength different from that of the blue colored film B1. Further, the second light shielding filter 634b is formed of the blue colored film B2 that transmits light having the same wavelength as the blue colored film B1, and the red colored film R2 that transmits light having the same wavelength as the red colored film R1. In this embodiment, the blue colored film B1, the red colored film R1, the blue colored film B2, and the red colored film R2 correspond to a first colored film, a second colored film, a third colored film, and a fourth colored film, respectively.

Here, the blue colored film B2 and the red colored film R2 forming the second light shielding filter 634b are colored films forming the first colored filter 633B and the second colored filter 633R of the colored filter portion 631. Therefore, the film formation of the second light shielding filter 634b can be performed at the same timing as the film formation of the colored filter portion 631.

Note that all of the colored filters 633 of the colored filter portion 631 may be provided on the element substrate 610 side. In this case, the first light shielding filter 634a is formed of the blue colored film B1 and the red colored film R1 that form the first colored filter 633B and the second colored filter 633R, respectively. In addition, the light shielding filters 634 may be formed by appropriately combining the colored films forming the colored filters 633. As described above, in this embodiment, at least one of the first or second light shielding filter 634a or 634b is formed of two colored films among a plurality of colored films forming the plurality of colored filters 633.

The first light shielding filter 634a includes a first stacked film 640a and a plurality of openings 650a. The first stacked film 640a is a stacked film in which the blue colored film B1 and the red colored film R1 are stacked. In FIG. 11, the red colored film R1 is stacked on a first opposing surface 11 (element substrate 610), and the blue colored film B1 is stacked thereon. Further, each of the plurality of openings 650a is a portion, which is formed in the first stacked film 640a and in which the first opposing surface 11 is exposed. Each opening 650a is, for example, a slit provided in the first stacked film 640a and is formed as a band-shaped region surrounding a display region 13. In this embodiment, the opening 650a corresponds to a first opening.

The second light shielding filter 634b includes a second stacked film 640b and a plurality of openings 650b. The second stacked film 640b is a stacked film in which the blue colored film B2 and the red colored film R2 are stacked. In FIG. 11, the red colored film R2 is stacked on the second opposing surface 21 (transparent substrate 620), and the blue colored film B2 is stacked thereon. Further, each of the plurality of openings 650b is a portion, which is formed in the second stacked film 640b so as not to overlap with the plurality of openings 650a provided in the first opposing surface 11 in plan view, and in which the second opposing surface 21 is exposed. For example, each opening 650b is a band-shaped region (slit) formed so as not to overlap with the slit-shaped opening 650a. In this embodiment, the opening 650b corresponds to a second opening.

The first and second stacked films 640a and 640b are light shielding films formed by stacking colored films that transmit light beams having different wavelengths. That is, each of the stacked films 640a and 640b exhibits a function of blocking light independently. Thus, the display device 600 has a structure in which the light shielding films are disposed on the substrates, and windows (openings 650a and 650b) for transmitting light are formed for the respective light shielding films so as not to overlap with each other.

For example, part of the light (visible light, ultraviolet light, or the like) incident on a peripheral portion 24 of the transparent substrate 620 is blocked by the second stacked film 640b, and other part of the light passes through the opening 650b and proceeds toward the element substrate 610. Light directed to the element substrate 610 is blocked by the first stacked film 640a provided on the element substrate 610. As a result, the peripheral portion 24 can be sufficiently shielded from light.

Further, the first and second light shielding filters 634a and 634b are provided with substantially the same openings 650a and 650b, respectively. As a result, an interface exhibiting the same wettability with respect to a sealant 642 is formed. As a result, it is possible to accurately control the line width or the like of the sealant 642. Further, as shown in FIG. 11, by using the same color resist as the material of the colored film disposed on the side that comes into contact with the sealant 642, unevenness in wettability between the upper and lower portions of the sealant 642 or the like can be sufficiently suppressed.

Fourth Embodiment

Figure 12:
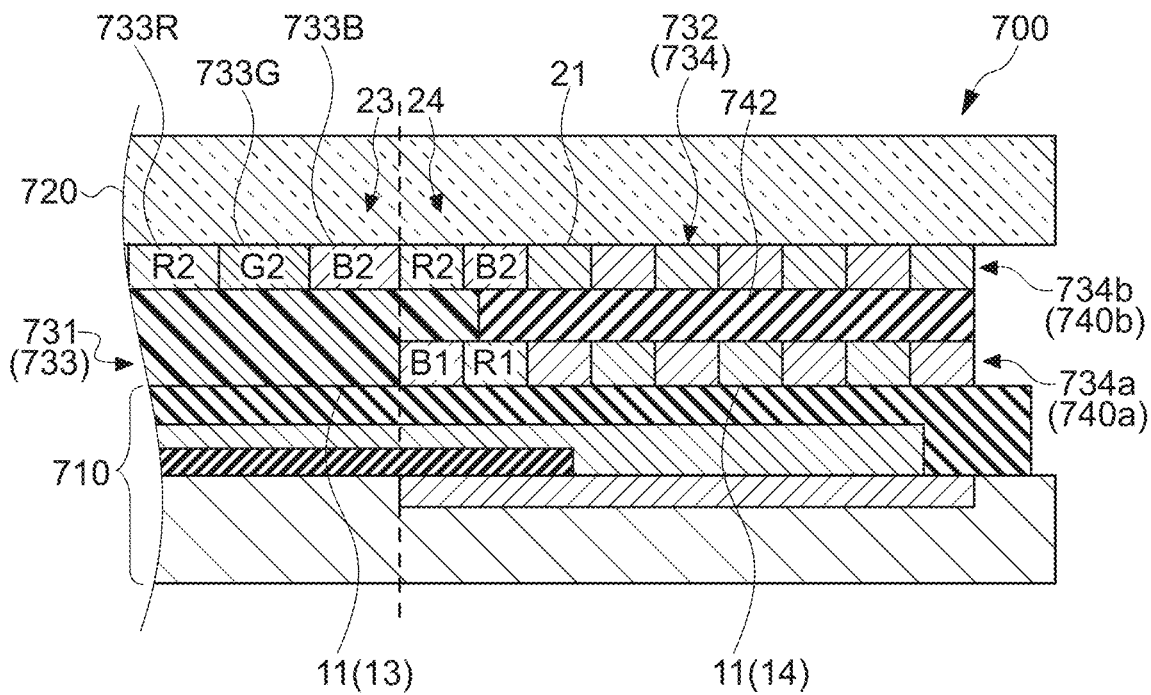
FIG. 12 is a schematic diagram showing a configuration example of a display device according to a fourth embodiment.

FIG. 12 is a schematic diagram showing a configuration example of a display device according to a fourth embodiment. In a display device 700 shown in FIG. 12, first and second light shielding filters 734a and 734b are formed using single-layer films in each of which two types of colored films are alternately arranged.

In the display device 700, a blue colored film B1 and a red colored film R1 are stacked on the element substrate 710 side. The blue colored film B1 and the red colored film R1 constitute the first light shielding filter 734a. Further, a blue colored film B2, a red colored film R2, and a green colored film G2, which constitute first to third colored filters 733B, 733R, and 733G of a colored filter portion 731, are stacked on the transparent substrate 720 side. Further, the blue colored film B2 and the red colored film R2 constitute the second light shielding filter 734b.

In this embodiment, the blue colored film B1, the red colored film R1, the blue colored film B2, and the red colored film R2 correspond to a first colored film, a second colored film, a third colored film, and a fourth colored film, respectively. Note that each of the colored filters 733 may be disposed on either substrate (element substrate 710 or transparent substrate 720). Further, the light shielding filter 732 (first and second light shielding filters 734a and 734b) may be appropriately formed of the same colored film as that of each colored filter 733.

As shown in FIG. 12, the first light shielding filter 734a has a first pattern film 740a in which the blue colored film B1 and the red colored film R1 are alternately arranged along the plane direction of the first opposing surface 11. The first pattern film 740a has the same film thickness as that of a single colored film and is a single-layer film. In the example shown in FIG. 12, a cross-sectional structure is schematically illustrated in which the blue colored films B1 and the red colored films R1 are alternately arranged in order from the boundary between a display region 13 and a peripheral region 14 (dotted line in the drawing).

The second light shielding filter 734b has a second pattern film 740b in which the red colored film R2 is disposed on the second opposing surface 21 so as to overlap with the blue colored film B1 in plan view, and the blue colored film B2 is disposed on the second opposing surface 21 so as to overlap with the red colored film R1 in plan view. The second pattern film 740b has the same film thickness as that of a single colored film and is a single-layer film. As shown in FIG. 12, in the second pattern film 740b, the red colored film R2 is disposed on the upper layer of the blue colored film B1 of the first pattern film 740a, and the blue colored film B2 is disposed on the upper layer of the red colored film R1.

For example, part of the visible light incident from the transparent substrate 720 is absorbed by the blue colored film B1 on the element substrate 710 after passing through the red colored film R2. Further, other part of the visible light is absorbed by the red colored film R1 on the element substrate 710 after passing through the blue colored film B2. In this manner, the color light beams transmitted through the second pattern film 740b are absorbed by the first pattern film 740a, and the peripheral region 14 is shielded from light.

In the second light shielding filter 734b, a region formed of the red colored film R2 is a region capable of transmitting ultraviolet light. Thus, it is possible to properly irradiate the sealant 742 with ultraviolet light, and to properly cure the UV curable adhesive (sealant 742). As a result, it is possible to achieve a highly reliable display device 700 by suppressing the peeling or the like of each substrate while maintaining the light shielding property.

As described above, the substrates are attached such that different color filters overlap with each other vertically, and thus it is possible to achieve a light shielding structure in which the upper and lower color filters are each formed of a single layer. As a result, peeling or the like of each light shielding filter can be sufficiently suppressed, and the yield in the manufacturing process can be sufficiently improved.

The specific configurations of the first pattern film 740a and the second pattern film 740b are not limited. For example, a pattern or the like in which the colored films are alternately arranged in a band-shaped region surrounding the display portion 23 (display region 13) is used. Alternatively, a pattern or the like in which a plurality of partial regions such as a circle or a rectangle is arranged may be used. In this case, one colored film is formed on each partial region, and the other colored film is formed so as to fill the periphery of each partial region. In either case, each of the colored films is selected such that light transmitted through the second pattern film 740b is blocked by the first pattern film 740a. Thus, it is possible to achieve a light shielding structure capable of transmitting ultraviolet light while maintaining the light shielding property.

Other Embodiments

The present technology is not limited to the embodiments described above and can achieve various other embodiments.

In the above embodiments, the case where the light shielding filter is configured by using the red colored film and the blue colored film has been mainly described. The present technology is not limited thereto, and a light shielding filter including a green colored film may be used.

Figure 13:
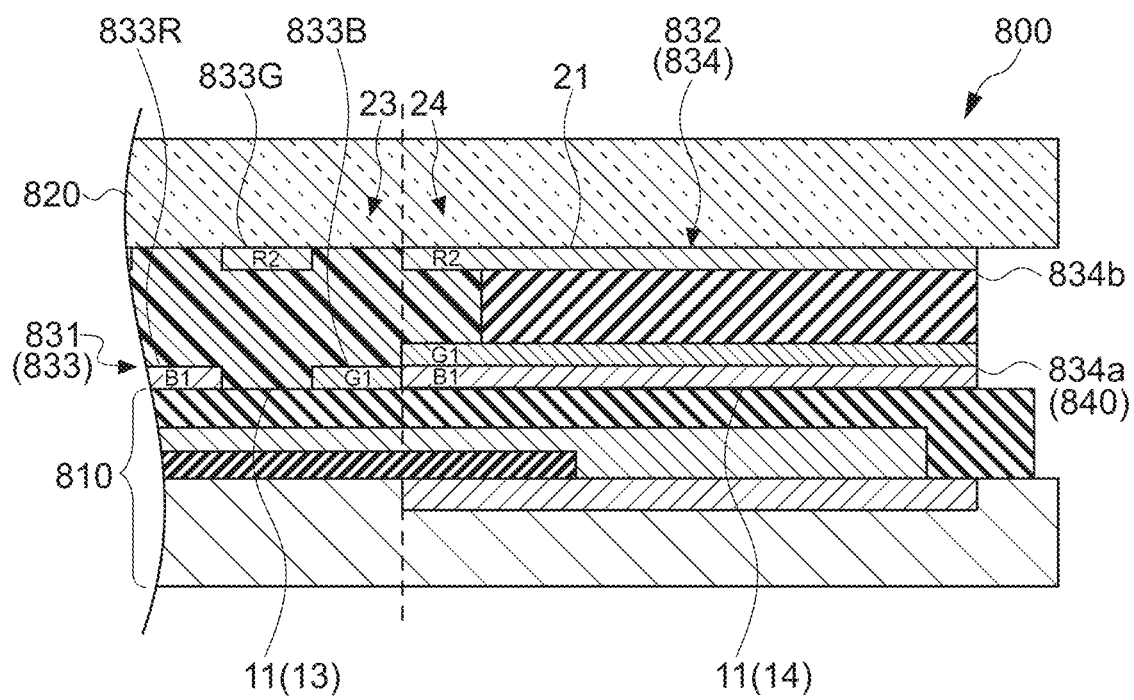
FIG. 13 is a schematic diagram showing a configuration example of a display device according to another embodiment.

FIG. 13 is a schematic diagram showing a configuration example of a display device according to another embodiment. In a display device 800 shown in FIG. 13, a first colored filter 833B and a third colored filter 833G of a colored filter portion 831 are disposed on a first opposing surface 11. Further, a second colored filter 833R is disposed on a second opposing surface 21.

A first light shielding filter 834a of a light shielding filter portion 832 includes a stacked film 840 in which the same colored film as the first colored filter 833B and the same colored film as the third colored filter 833G are stacked. In the stacked film 840 shown in FIG. 13, the same blue colored film B1 as the first colored filter 833B is stacked on the first opposing surface 11 (element substrate 810), and the same green colored film G1 as the third colored filter 833G is stacked thereon.

A second light shielding filter 834b is formed of the same colored film as the second colored filter 833R, that is, the red colored film R2. Thus, the second light shielding filter 834b can transmit ultraviolet light, and a UV curable adhesive can be used.

In this manner, in the display device 800, a light shielding structure is configured in which the red colored film R2, the green colored film G1, and the blue colored film B1 are arranged in order from the transparent substrate 820 side so as to overlap with each other in plan view. Thus, it is possible to sufficiently attenuate external light or the like incident from the transparent substrate 820 side and to exhibit excellent light shielding property.

In addition, in order to configure the light shielding filter portion 832, all of the colored films constituting the colored filters 833 are used. In other words, simultaneously with the film formation of the colored filters 833, the film formation of the color filters (first and second light shielding filters 834a and 834b) necessary for the light shielding structure is completed. Thus, it is possible to manufacture a display device 800 having high light shielding property without adding a new film forming step.

In the above embodiments, a red colored film (red color resist) capable of transmitting ultraviolet light is used as the second light shielding filter disposed on the transparent substrate side. The present technology is not limited to the above, and the second light shielding filter may be formed of any colored film capable of transmitting ultraviolet light.

For example, a blue colored film capable of transmitting ultraviolet light or the like may be used as the second light shielding filter. In this case, a colored film (such as a red colored film or a green colored film) that absorbs blue light transmitted through the blue colored film is used for the first light shielding filter. In addition, any combination of colored films capable of transmitting ultraviolet light and maintaining light shielding performance may be appropriately selected.

In addition, the type or the like of the colored film used as the colored filter and the light shielding filter is not limited. For example, in the example shown in FIG. 4, the same material as the blue colored film B2 stacked on the transparent substrate side is used as the colored film (blue colored film B1) stacked on the element substrate side. In place of this blue colored film B1, a colored film of any color capable of absorbing light transmitted through the red colored film R2 of the upper layer may be used. That is, the color of the color filter constituting the light shielding structure is not limited to R, G, and B.

In the above, a sealant containing a UV curable adhesive that is cured by ultraviolet light has been described. The specific configuration of the sealant is not limited. For example, as a sealant, a photocurable adhesive that is cured by light having a predetermined wavelength, such as red light, green light, or blue light, may be used as a sealant. In this case, the second light shielding filter to be disposed on the transparent substrate side is formed such that light having a wavelength capable of curing the sealant can pass therethrough, and thus it is possible to properly cure the sealant.

In addition, as the sealant (transparent adhesive layer), a thermosetting adhesive that is cured by heating may be used instead of a photocurable adhesive. In this case, the second light shielding filter does not need to transmit ultraviolet light or the like, and may be appropriately configured to achieve the light shielding performance in combination with the first light shielding filter. By using the thermosetting adhesive as described above, it is possible to enhance the degree of freedom in design, which makes it possible to widen the selection range of the colored film.

In the above embodiments, the sealant is used as the transparent adhesive layer for bonding the transparent substrate and the element substrate. Each substrate may be bonded using a filler without using a sealant, for example. In other words, a filler provided between the transparent substrate and the element substrate may be used as the transparent adhesive layer. Thus, it becomes possible to omit the application step of the sealant and the like, and to simplify the manufacturing process.

In the above description, the display device including the top emission type organic EL element that emits light from the common electrode side has been described, but the present technology is not limited thereto. For example, a bottom emission type organic EL element that emits light from the pixel electrode side may be used. In this case, the color filter layer and the transparent substrate are disposed on the side opposite to the side where the organic EL element (organic light emitting layer) is formed in the element substrate.

In the bottom emission type organic EL element, for example, a transparent pixel electrode is formed on a transparent element substrate (glass substrate, etc.). An organic light emitting layer and a common electrode are formed above the pixel electrode. Here, the common electrode functions as a metal reflective film that reflects light. Alternatively, a metal reflective film may be provided separately from the common electrode. Below the pixel electrode, for example, a window portion from which light of the organic EL element is extracted is formed, and a pixel circuit or the like is disposed around the window portion. The window portion corresponding to each organic EL element is formed in the element substrate, and the region where each window portion is formed serves as a display region where an image is to be displayed.

On the lower side of the element substrate, a color filter layer is provided to avoid a bonding region provided around the display region. In addition, a sealant or the like is applied to the bonding region to bond a transparent substrate. Light generated by the organic light emitting layer passes through the pixel electrode, the window portion, and the color filter layer and is emitted from the transparent substrate.

Even in such a configuration, when the color filters (first and second light shielding filters) are separately disposed on the element substrate side and the transparent substrate side, it is possible to avoid peeling of the color filters while maintaining the light shielding property. As a result, it is possible to improve the yield in the manufacturing process.

FIGS. 14A, 14B, 15A, 15B, 16, and 17 are schematic diagrams each showing an example of an electronic apparatus equipped with a display device according to another embodiment. In the above description, the display device configured as a module has been described. The present technology is applicable to various electronic apparatuses in which the display device is mounted. Hereinafter, examples of other display devices will be described with reference to FIGS. 14A, 14B, 15A, 15B, 16, and 17.

Figure 14A:
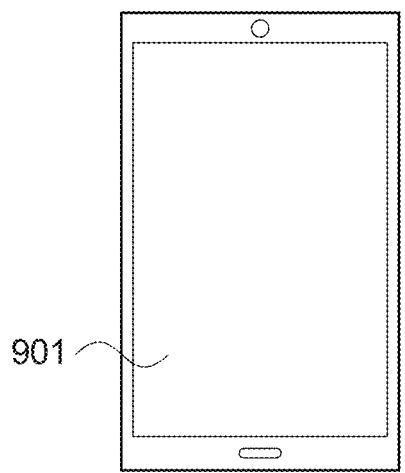
FIGS. 14A and 14B are schematic diagrams showing an example of an electronic apparatus equipped with a display device according to another embodiment.
Figure 14B:
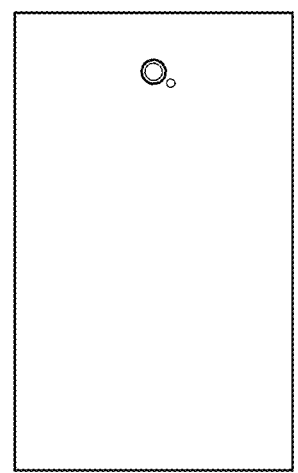

FIGS. 14A and 14B show the appearance of a mobile terminal. FIG. 14A is a front view of a mobile terminal 900, and FIG. 14B is a rear view of the mobile terminal 900. A display 901 for display is disposed in front of the mobile terminal 900. The display device described above can be used as the display 901.

Figure 15A:
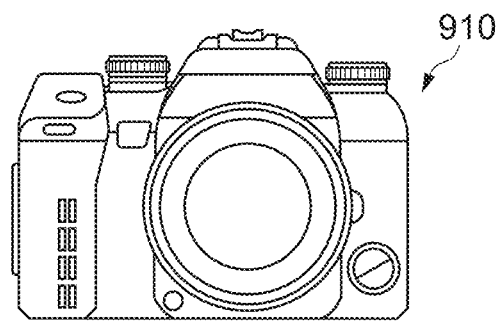
FIGS. 15A and 15B are schematic diagrams showing an example of an electronic apparatus equipped with a display device according to another embodiment.
Figure 15B:
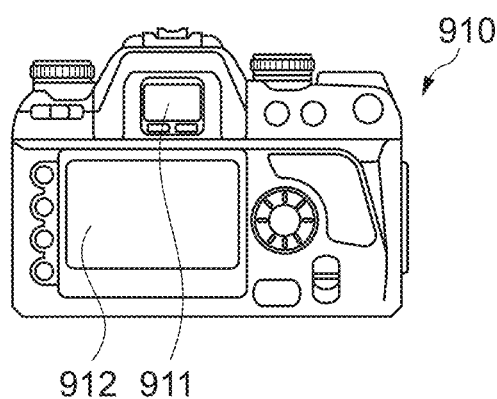

FIGS. 15A and 15B show the appearance of a digital camera. FIG. 15A is a front view of a digital camera 910, and FIG. 15B is a rear view of the digital camera 910. The digital camera 910 includes a viewfinder unit 911, and the display device or the like described above is used for the viewfinder unit 911. In this case, the display device is configured as a microdisplay. Further, the digital camera 910 also includes a rear display 912. The display device may be used for the rear display 912.

Figure 16:
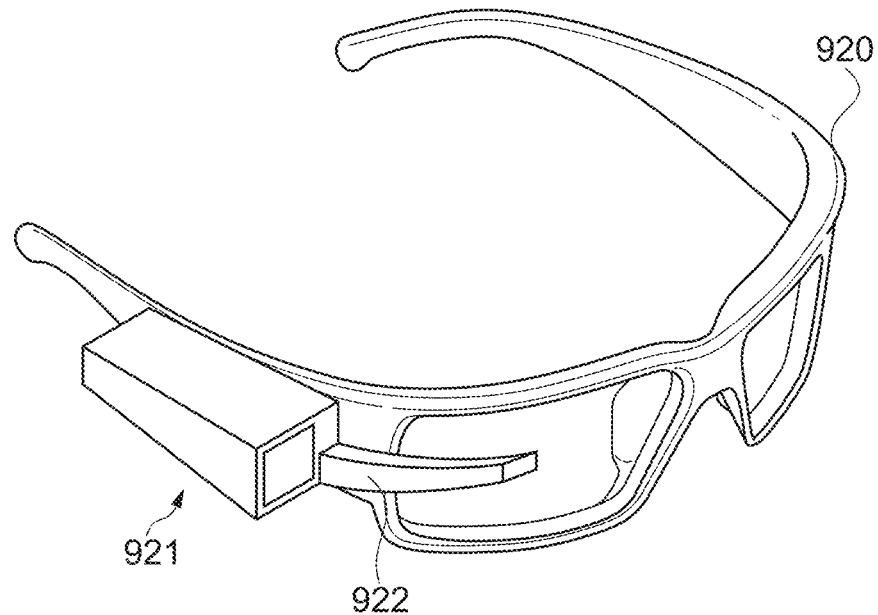
FIG. 16 is a schematic diagram showing an example of an electronic apparatus equipped with a display device according to another embodiment.

FIG. 16 shows the appearance of an eyewear 920 such as eyeglasses, goggles, and sunglasses in which an eyewear-mounted type one-eye display module 921 is mounted. The eyewear-mounted type one-eye display module 921 includes, for example, a light source and an organic EL element 922. The display device or the like described above is applied to the organic EL element.

Figure 17:
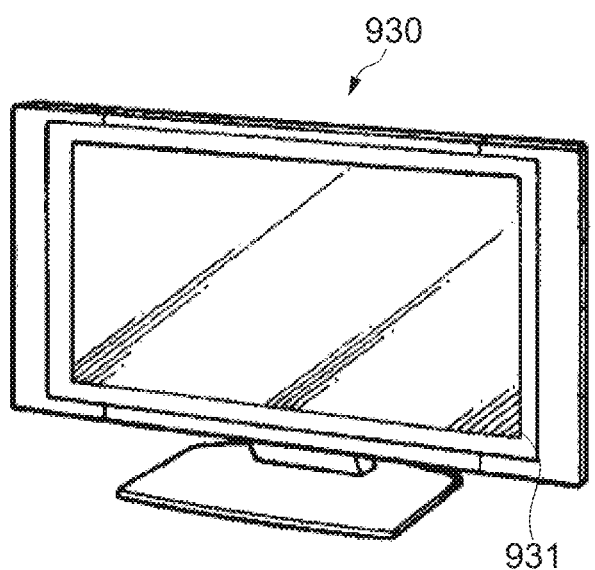
FIG. 17 is a schematic diagram showing an example of an electronic apparatus equipped with a display device according to another embodiment.

FIG. 17 shows the appearance of a television apparatus 930 as an electronic apparatus. The television apparatus 930 includes a flat panel type organic EL display 931. The display device described above can be used as the organic EL display 931.

Of the feature portions according to the present technology described above, at least two feature portions can be combined. That is, the various feature portions described in the embodiments may be arbitrarily combined without distinguishing between the embodiments. Further, the various effects described above are not limitative but are merely illustrative, and other effects may be provided.

In the present disclosure, "same", "equal", "orthogonal", and the like are concepts including "substantially the same", "substantially equal", "substantially orthogonal", and the like. For example, the states included in a predetermined range (e.g., ±10%) with reference to "completely the same", "completely equal", "completely orthogonal", and the like are also included.

Note that the present technology may also take the following configurations.

(1) A display device, including:
  an element substrate including a first surface, an organic EL element that emits light from a display region of the first surface, and peripheral wiring disposed to overlap in plan view with a peripheral region surrounding the display region;
  a transparent substrate including a second surface facing the first surface;
  a light shielding filter portion that includes a first color filter disposed in the peripheral region of the first surface and a second color filter disposed on the second surface to face the first color filter, and shields the peripheral wiring from light; and
  a transparent adhesive layer that is provided between the first color filter and the second color filter and bonds the element substrate and the transparent substrate to each other.

(2) The display device according to (1), in which
  the first color filter limits visible light having passed through the second color filter.

(3) The display device according to (1) or (2), in which
  the second color filter passes a light beam having a predetermined wavelength, and
  the transparent adhesive layer includes a photocurable adhesive that is cured by the light beam having the predetermined wavelength.

(4) The display device according to any one of (1) to (3), further including
a colored filter portion including a plurality of colored filters, each of which is disposed on one of the first surface and the second surface and transmits light beams having wavelengths different from each other to color the light of the organic EL element.
(5) The display device according to (4), in which
at least one of the first color filter or the second color filter includes at least one of a plurality of colored films constituting the plurality of colored filters.
(6) The display device according to (4) or (5), in which
the plurality of colored filters includes a first colored filter, a second colored filter, and a third colored filter that transmit the light beams having wavelengths different from each other.
(7) The display device according to (6), in which
the first color filter transmits a light beam having the same wavelength as a wavelength of the first colored filter, and
the second color filter transmits a light beam having the same wavelength as a wavelength of the second colored filter.
(8) The display device according to (6) or (7), in which
the second colored filter is disposed on the second surface, and
the second color filter includes a colored film identical to a colored film of the second colored filter.
(9) The display device according to any one of (6) to (8), in which
the first colored filter is disposed on the first surface, and
the first color filter includes a colored film identical to a colored film of the first colored filter.
(10) The display device according to any one of (6) to (9), in which
the first colored filter and the third colored filter are disposed on the first surface, and
the first color filter includes a stacked film in which a colored film identical to a colored film of the first colored filter and a colored film identical to a colored film of the third colored filter are stacked.
(11) The display device according to any one of (1) to (10), in which
the second color filter includes a single colored film, and
the first color filter includes a single colored film that transmits a light beam having a wavelength different from a wavelength of a colored film constituting the second color filter.
(12) The display device according to (11), in which the second color filter transmits red light, and the first color filter transmits blue light.
(13) The display device according to (11) or (12), in which
the second color filter includes a plurality of openings in each of which the second surface is exposed, and
the first color filter is disposed to cover the peripheral region of the first surface.
(14) The display device according to any one of (1) to (6), in which
the first color filter includes a first colored film and a second colored film that transmits a light beam having a wavelength different from a wavelength of the first colored film, and
the second color filter includes a third colored film that transmits a light beam having a wavelength identical to the wavelength of the first colored film, and a fourth colored film that transmits a light beam having a wavelength identical to the wavelength of the second colored film.
(15) The display device according to (14), in which
the first color filter includes a first stacked film in which the first colored film and the second colored film are stacked in layers, and a plurality of first openings formed on the first stacked film, the first surface being exposed in each of the plurality of first openings, and
the second color filter includes a second stacked film in which the third colored film and the fourth colored film are stacked in layers, and a plurality of second openings formed on the second stacked film without overlapping with the plurality of first openings in plan view, the second surface being exposed in each of the plurality of second openings.
(16) The display device according to (14), in which
the first color filter includes a first pattern film in which the first colored film and the second colored film are alternately disposed along a plane direction of the first surface, and
the second color filter includes a second pattern film in which the third colored film is disposed on the second surface to overlap with the first colored film in plan view, and the fourth colored film is disposed on the second surface to overlap with the second colored film in plan view.
(17) The display device according to any one of (1) to (16), in which
the transparent adhesive layer includes a photocurable adhesive or a thermosetting adhesive.
(18) The display device according to any one of (1) to (17), in which
the transparent adhesive layer is a sealant applied to surround the display region or a filler provided between the transparent substrate and the element substrate.
(19) An electronic apparatus, including:
a display device including
an element substrate including a first surface, an organic EL element that emits light from a display region of the first surface, and peripheral wiring disposed to overlap in plan view with a peripheral region surrounding the display region,
a transparent substrate including a second surface facing the first surface,
a light shielding filter portion that includes a first color filter disposed in the peripheral region of the first surface and a second color filter disposed on the second surface to face the first color filter, and shields the peripheral wiring from light, and
a transparent adhesive layer that is provided between the first color filter and the second color filter and bonds the element substrate and the transparent substrate to each other; and
a drive circuit that drives the display device.

REFERENCE SIGNS LIST

B1, B2 blue colored film
R1, R2 red colored film
G1, G2 green colored film
10, 210, 310, 410, 510, 610, 710, 810 element substrate
11 first opposing surface
12 organic EL element 13 display region
14 peripheral region
20, 220, 320, 420, 520, 620, 720, 820 transparent substrate
21 second opposing surface
26 drive circuit
31, 231, 331, 431, 531, 631, 731, 831 colored filter portion
32, 232, 332, 432, 532, 632, 732, 832 light shielding filter portion
33B, 233B, 333B, 433B, 533B, 633B, 733B, 833B first colored filter
33R, 233R, 333R, 433R, 533R, 633R, 733R, 833R second colored filter
33G, 233G, 333G, 433G, 533G, 633G, 733G, 833G third colored filter
34a, 234a, 334a, 434a, 534a, 634a, 734a, 834a first light shielding filter
34b, 234b, 334b, 434b, 534b, 634b, 734b, 834b second light shielding filter
40 transparent adhesive layer
41 filler
42, 442, 642, 742 sealant
60 peripheral wiring
100, 200, 300, 400, 500, 600, 700, 800 display device

What is claimed is:

1. A display device, comprising:
a first substrate that includes a first face and a peripheral region;
a plurality of organic electroluminescent elements on the first substrate;
a plurality of color filters on the plurality of organic electroluminescent elements, wherein
the plurality of color filters includes a first color filter and a second color filter, and
a part of the first color filter and a part of the second color filter are stacked in the peripheral region of the first substrate;
a protection member on the plurality of color filters;
a second substrate that includes a second face, wherein the second face faces the plurality of color filters; and
a seal member, between the first face and the second face, in the peripheral region.

2. The display device according to claim 1, wherein
in the peripheral region, the part of the first color filter and the part of the second color filter are between the first face and the second face, and
the seal member is between the part of the first color filter and the part of the second color filter.

3. The display device according to claim 1, wherein
the first color filter is configured to transmit a light beam of a first wavelength, and
the second color filter is configured to transmit a light beam of a second wavelength, different from the first wavelength, to color light of an organic electroluminescent element of the plurality of organic electroluminescent elements.

4. The display device according to claim 1, wherein a film thickness of each of the first color filter and the second color filter is reducible.

5. The display device according to claim 1, wherein each of the first color filter and the second color filter includes a single-layer colored film.

6. The display device according to claim 1, wherein
the second color filter is on the first color filter, and
the second color filter is configured to transmit ultraviolet rays.

7. The display device according to claim 6, wherein
the second color filter is configured to transmit red light, and
the first color filter is configured to transmit blue light.

8. The display device according to claim 1, wherein in a case where the first substrate is bonded to the second substrate, a line width of the seal member is controllable.

9. An electronic apparatus, comprising:
a display device including:
a first substrate that includes a first face and a peripheral region;
a plurality of organic electroluminescent elements on the first substrate;
a plurality of color filters on the plurality of organic electroluminescent elements, wherein
the plurality of color filters includes a first color filter and a second color filter, and
a part of the first color filter and a part of the second color filter are stacked in the peripheral region of the first substrate;
a protection member on the plurality of color filters;
a second substrate that includes a second face, wherein the second face faces the plurality of color filters; and
a seal member, between the first face and the second face, in the peripheral region.

10. The electronic apparatus according to claim 9, wherein
in the peripheral region, the part of the first color filter and the part of the second color filter are between the first face and the second face, and
the seal member is further between the part of the first color filter and the part of the second color filter.

11. The electronic apparatus according to claim 9, wherein
the first color filter is configured to transmit a light beam of a first wavelength, and
the second color filter is configured to transmit a light beam of a second wavelength, different from the first wavelength, to color light of an organic electroluminescent element of the plurality of organic electroluminescent elements.

12. The electronic apparatus according to claim 9, wherein each of the first color filter and the second color filter includes a single-layer colored film.

13. The electronic apparatus according to claim 9, wherein
the second color filter is on the first color filter, and
the second color filter is configured to transmit ultraviolet rays.

14. The electronic apparatus according to claim 13, wherein
the second color filter is configured to transmit red light, and
the first color filter is configured to transmit blue light.

15. The electronic apparatus according to claim 9, wherein in a case where the first substrate is bonded to the second substrate, a line width of the seal member is controllable.

16. The electronic apparatus according to claim 9, wherein a film thickness of each of the first color filter and the second color filter is reducible.

* * * * *